US012701748B2

(12) United States Patent     (10) Patent No.:   US 12,701,748 B2

Byeon et al.        (45) Date of Patent:     Aug. 4, 2026

(54) SEMICONDUCTOR DEVICE AND METHOD OF FABRICATING THE SAME

(71) Applicant: Samsung Electronics Co., Ltd., Suwon-si (KR)

(72) Inventors: Hyohoon Byeon, Suwon-si (KR); Sungkeun Lim, Suwon-si (KR); Yuyeong Jo, Suwon-si (KR); Jinyeong Joe, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 588 days.

(21) Appl. No.: 18/121,869

(22) Filed: Mar. 15, 2023

(65) Prior Publication Data

US 2024/0021734 A1     Jan. 18, 2024

(30) Foreign Application Priority Data

Jul. 14, 2022    (KR) ........................ 10-2022-0086793

(51) Int. Cl.
    *H10D 30/67*       (2025.01)
    *H10D 30/43*       (2025.01)
          (Continued)

(52) U.S. Cl.
    CPC ......... *H10D 30/6757* (2025.01); *H10D 30/43* (2025.01); *H10D 30/6735* (2025.01); *H10D 62/121* (2025.01); *H10D 84/85* (2025.01)

(58) Field of Classification Search
None
See application file for complete search history.

(56) References Cited

U.S. PATENT DOCUMENTS 9,991,352 B1    6/2018   Frougier et al.
10,014,390 B1   7/2018   Bouche et al.
             (Continued)

FOREIGN PATENT DOCUMENTS

JP       2011029503 A    2/2011
KR   1020220000797 A   1/2022

OTHER PUBLICATIONS

A. Terrasi et al., "Rapid thermal oxidation of epitaxial SiGe thin films," Materials Science and Engineering B89 (2002) 269-273.

(Continued)

*Primary Examiner* — Yara B Green
*Assistant Examiner* — Coralie A Nettles
(74) *Attorney, Agent, or Firm* — Muir Patent Law, PLLC

(57)          ABSTRACT

A semiconductor device and a fabrication method thereof are disclosed. The device includes a substrate including an active pattern, a channel pattern on the active pattern, the channel pattern including a plurality of vertically-stacked semiconductor patterns, a source/drain pattern connected to the semiconductor patterns, a gate electrode on the semiconductor patterns, the gate electrode including a first portion interposed between first and second semiconductor patterns, which are two adjacent ones of the semiconductor patterns, and a gate insulating layer interposed between the first portion of the gate electrode and the first and second semiconductor patterns. The second semiconductor pattern is located at a tier higher than the first semiconductor pattern. The first semiconductor pattern includes a first channel recess having a first depth, and the second semiconductor pattern includes a second channel recess having a second depth smaller than the first depth.

19 Claims, 43 Drawing Sheets

(51) Int. Cl.
_H10D 62/10_  (2025.01)
_H10D 84/85_  (2025.01)

(56)  References Cited

U.S. PATENT DOCUMENTS

| | | | |
|---|---|---|---|
| 10,546,942 B2 | 1/2020 | Cheng et al. | |
| 10,886,368 B2 | 1/2021 | Zhang et al. | |
| 10,903,317 B1 | 1/2021 | Frougier et al. | |
| 10,978,593 B2 | 4/2021 | Leobandung | |
| 11,289,584 B2 | 3/2022 | Wu et al. | |
| 2017/0222006 A1* | 8/2017 | Suh | H10D 30/43 |
| 2020/0185539 A1 | 6/2020 | Lee et al. | |
| 2020/0357911 A1 | 11/2020 | Frougier et al. | |
| 2021/0036122 A1 | 2/2021 | Wong et al. | |
| 2021/0134785 A1* | 5/2021 | Yang | H10D 89/10 |
| 2021/0135008 A1* | 5/2021 | Chiang | H10D 30/6735 |
| 2021/0328059 A1 | 10/2021 | Chung et al. | |
| 2021/0408289 A1* | 12/2021 | Guha | H10D 30/024 |
| 2022/0173253 A1 | 6/2022 | Yeom et al. | |
| 2022/0328698 A1* | 10/2022 | Lin | H10D 30/6757 |
| 2022/0384610 A1* | 12/2022 | Liu | H10D 84/038 |

OTHER PUBLICATIONS

J.Y. Kim et al., "S-RCAT (sphere-shaped-recess-channel-array transistor) technology for 70nm DRAM feature size and beyond," 2005 Symposium on VLSI Technology Digest of Technical Papers.

J.Y. Kim et al., "The breakthrough in data retention time of DRAM using Recess-Channel-Array Transistor (RCAT) for 88 nm feature size and beyond," 2003 Symposium on VLSI Technology. Digest of Technical Papers.

J.Y.Seo et al., "Reliability for Recessed Channel Structure n-MOSFET," Microelectronics Reliability 45 (2005) 1317-1320.

M. Chan et al.,"Recess channel structure for reducing source/drain series resistance in ultra-thin SOI MOSFETs," Proceedings of 1993 IEEE International SOI Conference.

Spadafora, M., et al, "Oxidation rate enhancement of SiGe epitaxial films oxidized in dry ambient," Appl. Phys. Lett., Nov. 3, 2003, vol. 83, No. 18.

* cited by examiner

FIG. 25

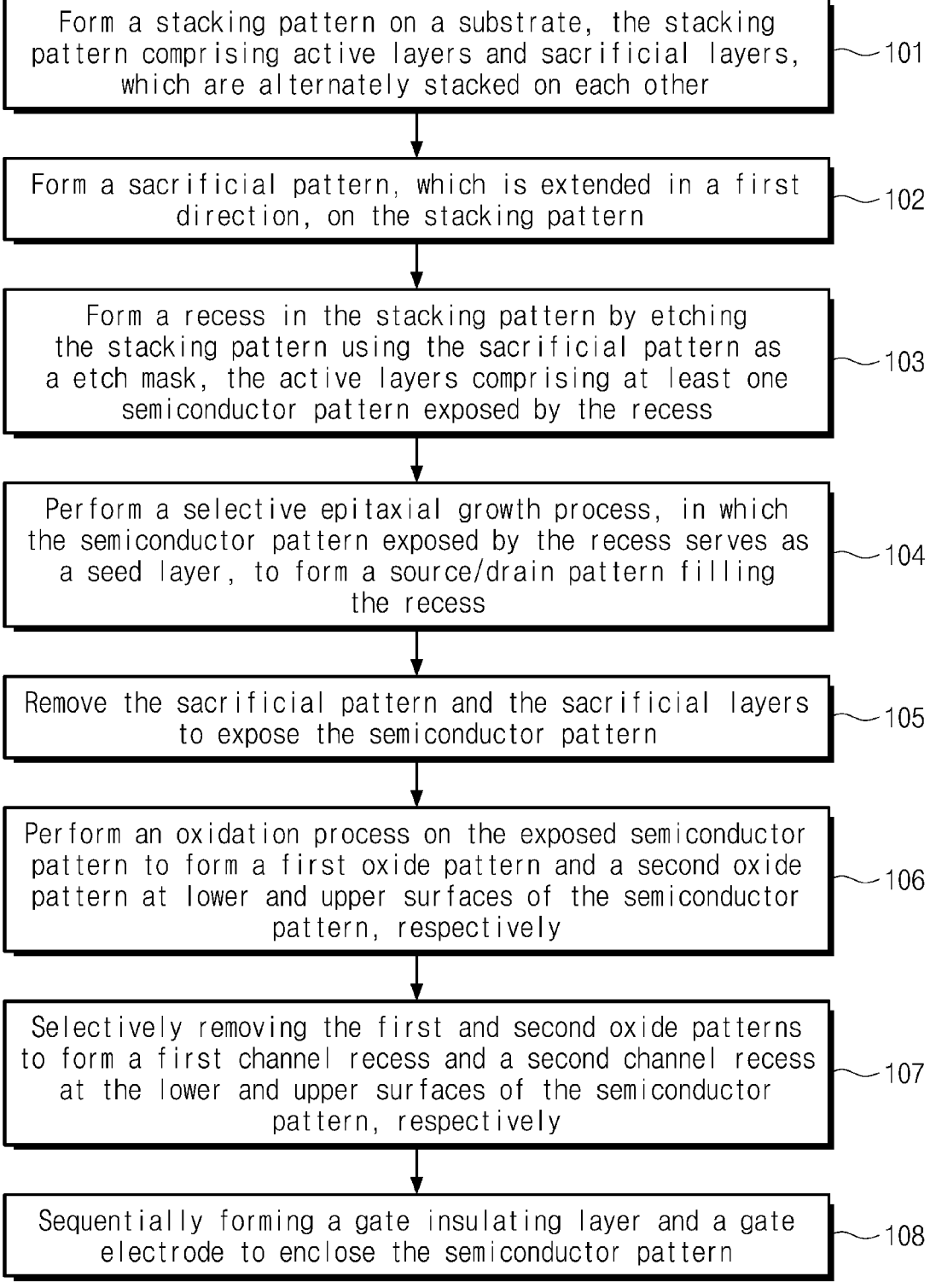

Form a stacking pattern on a substrate, the stacking pattern comprising active layers and sacrificial layers, which are alternately stacked on each other — 101

Form a sacrificial pattern, which is extended in a first direction, on the stacking pattern — 102

Form a recess in the stacking pattern by etching the stacking pattern using the sacrificial pattern as a etch mask, the active layers comprising at least one semiconductor pattern exposed by the recess — 103

Perform a selective epitaxial growth process, in which the semiconductor pattern exposed by the recess serves as a seed layer, to form a source/drain pattern filling the recess — 104

Remove the sacrificial pattern and the sacrificial layers to expose the semiconductor pattern — 105

Perform an oxidation process on the exposed semiconductor pattern to form a first oxide pattern and a second oxide pattern at lower and upper surfaces of the semiconductor pattern, respectively — 106

Selectively removing the first and second oxide patterns to form a first channel recess and a second channel recess at the lower and upper surfaces of the semiconductor pattern, respectively — 107

Sequentially forming a gate insulating layer and a gate electrode to enclose the semiconductor pattern — 108

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0086793, filed on Jul. 14, 2022, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may deteriorate operational properties of the semiconductor device. A variety of studies are being conducted to overcome technical limitations associated with the scale-down of the semiconductor device and to realize the semiconductor devices with high performance.

SUMMARY

An embodiment of the inventive concept provides a semiconductor device with improved reliability and electric characteristics.

An embodiment of the inventive concept provides a method of fabricating a semiconductor device with improved reliability and electrical characteristics.

According to an embodiment of the inventive concept, a semiconductor device may include a substrate provided with an active pattern, a channel pattern on the active pattern, the channel pattern including semiconductor patterns, which are vertically stacked to be spaced apart from each other, a source/drain pattern connected to the semiconductor patterns, a gate electrode on the semiconductor patterns, the gate electrode including a first portion interposed between a first semiconductor pattern and a second semiconductor pattern, which are two adjacent semiconductor patterns of the semiconductor patterns, and a gate insulating layer interposed between the first portion of the gate electrode and each of the first and second semiconductor patterns. The second semiconductor pattern may be located higher than the first semiconductor pattern. The first semiconductor pattern may include an upper surface with a first channel recess having a first depth, and the second semiconductor pattern may include a lower surface with a second channel recess having a second depth smaller than the first depth.

According to an embodiment of the inventive concept, a semiconductor device may include a substrate provided with an active pattern, a channel pattern on the active pattern, the channel pattern including semiconductor patterns, which are vertically stacked to be spaced apart from each other, a source/drain pattern connected to the semiconductor patterns, a gate electrode on the semiconductor patterns, the gate electrode including a first portion interposed between a first semiconductor pattern and a second semiconductor pattern, which are two adjacent semiconductor patterns of the semiconductor patterns, and a gate insulating layer interposed between the first portion of the gate electrode and each of the first and second semiconductor patterns. The first portion of the gate electrode may have a sandglass shape. The first portion may include a lower portion, an upper portion, and an interface between the lower portion and the upper portion. A width of the first portion may decrease as a height is lowered from an upper surface of the first portion toward the interface, may have a minimum value at the interface, and may increase as the height is lowered from the interface toward a lower surface of the first portion. A volume of the lower portion may be larger than a volume of the upper portion.

According to an embodiment of the inventive concept, a semiconductor device may include a substrate including an active region, a device isolation layer defining an active pattern on the active region, a channel pattern and a source/drain pattern on the active pattern, the channel pattern including semiconductor patterns, which are vertically stacked to be spaced apart from each other, a gate electrode on the semiconductor patterns, the gate electrode including portions respectively interposed between two adjacent semiconductor patterns among the semiconductor patterns, a gate insulating layer enclosing each portion of the portions of the gate electrode, a gate spacer on a side surface of the gate electrode, a gate capping pattern on a top surface of the gate electrode, an interlayer insulating layer on the gate capping pattern, an active contact penetrating the interlayer insulating layer and electrically connected to the source/drain pattern, a metal-semiconductor compound layer interposed between the active contact and the source/drain pattern, a gate contact penetrating the interlayer insulating layer and the gate capping pattern and electrically connected to the gate electrode, a first metal layer on the interlayer insulating layer, the first metal layer including a power line and a first interconnection line, which are electrically connected to the active contact and the gate contact, respectively, and a second metal layer on the first metal layer. The second metal layer may include a second interconnection line, which is electrically connected to the first metal layer. The semiconductor patterns may include channel recesses, respectively. Depths of the channel recesses decrease as a distance increases in a vertical direction from a lowermost semiconductor pattern among the semiconductor patterns toward an uppermost semiconductor pattern among the semiconductor patterns.

According to an embodiment of the inventive concept, a method of fabricating a semiconductor device may include forming a stacking pattern on a substrate, the stacking pattern including active layers and sacrificial layers, which are alternately stacked, forming a sacrificial pattern, which is extended in a first direction, on the stacking pattern, forming a recess in the stacking pattern by etching the stacking pattern using the sacrificial pattern as a etch mask, the active layers including at least one semiconductor pattern exposed by the recess, performing a selective epitaxial growth process, in which the semiconductor pattern exposed by the recess serves as a seed layer, to form a source/drain pattern filling the recess, removing the sacrificial pattern and the sacrificial layers to expose the semiconductor pattern, performing an oxidation process on the exposed semiconductor pattern to form a first oxide pattern and a second oxide pattern at lower and upper surfaces of the semiconductor pattern, respectively, selectively removing the first and second oxide patterns to form a first channel recess and a second channel recess at the lower and upper surfaces of the semiconductor pattern, respectively, and sequentially forming a gate insulating layer and a gate electrode to enclose the semiconductor pattern.

BRIEF DESCRIPTION OF THE DRAWINGS

FIG. 25 is a flowchart of fabricating the semiconductor device according to an embodiment of the inventive concept.

FIG. 25 is a flowchart of fabricating the semiconductor device according to an embodiment of the inventive concept.

DETAILED DESCRIPTION

Example embodiments of the inventive concepts will now be described more fully with reference to the accompanying drawings, in which example embodiments are shown.

Figure 1:
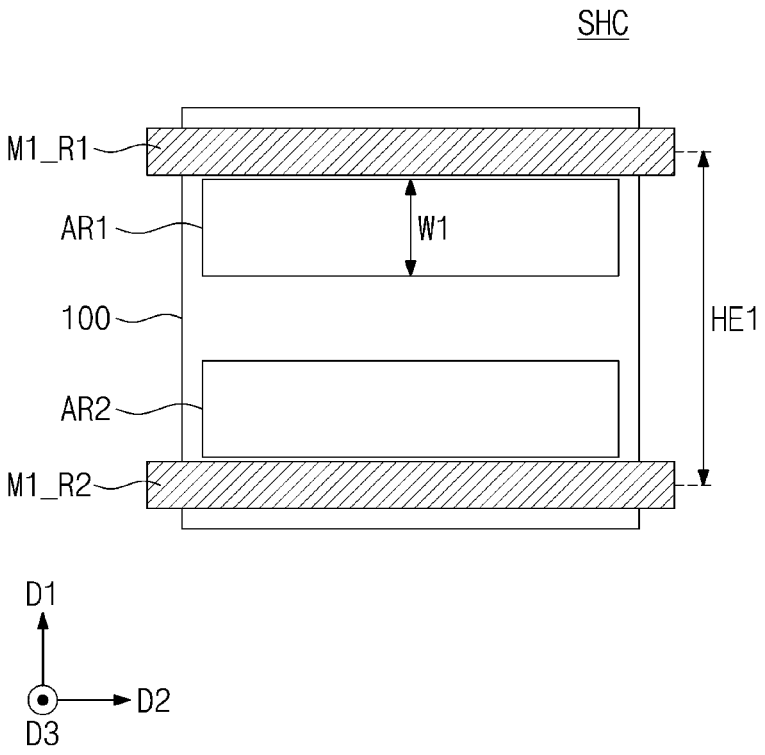
FIGS. 1 to 3 are conceptual diagrams illustrating logic cells of a semiconductor device according to an embodiment of the inventive concept.
Figure 2:
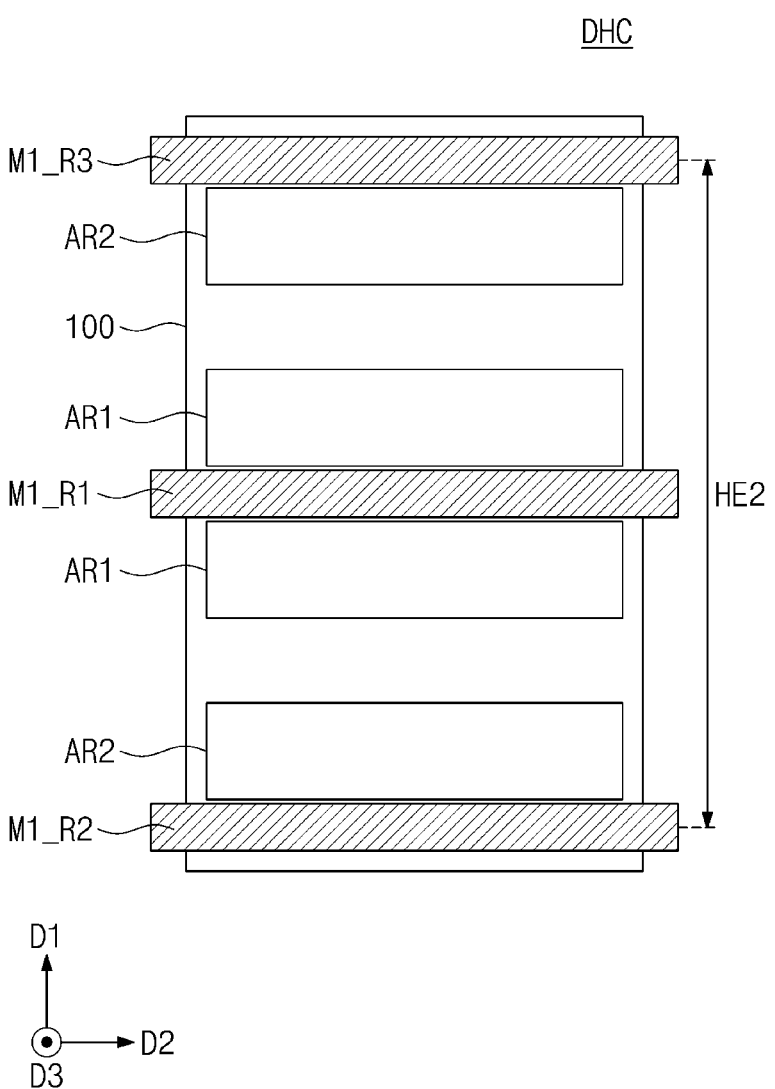
Figure 3:
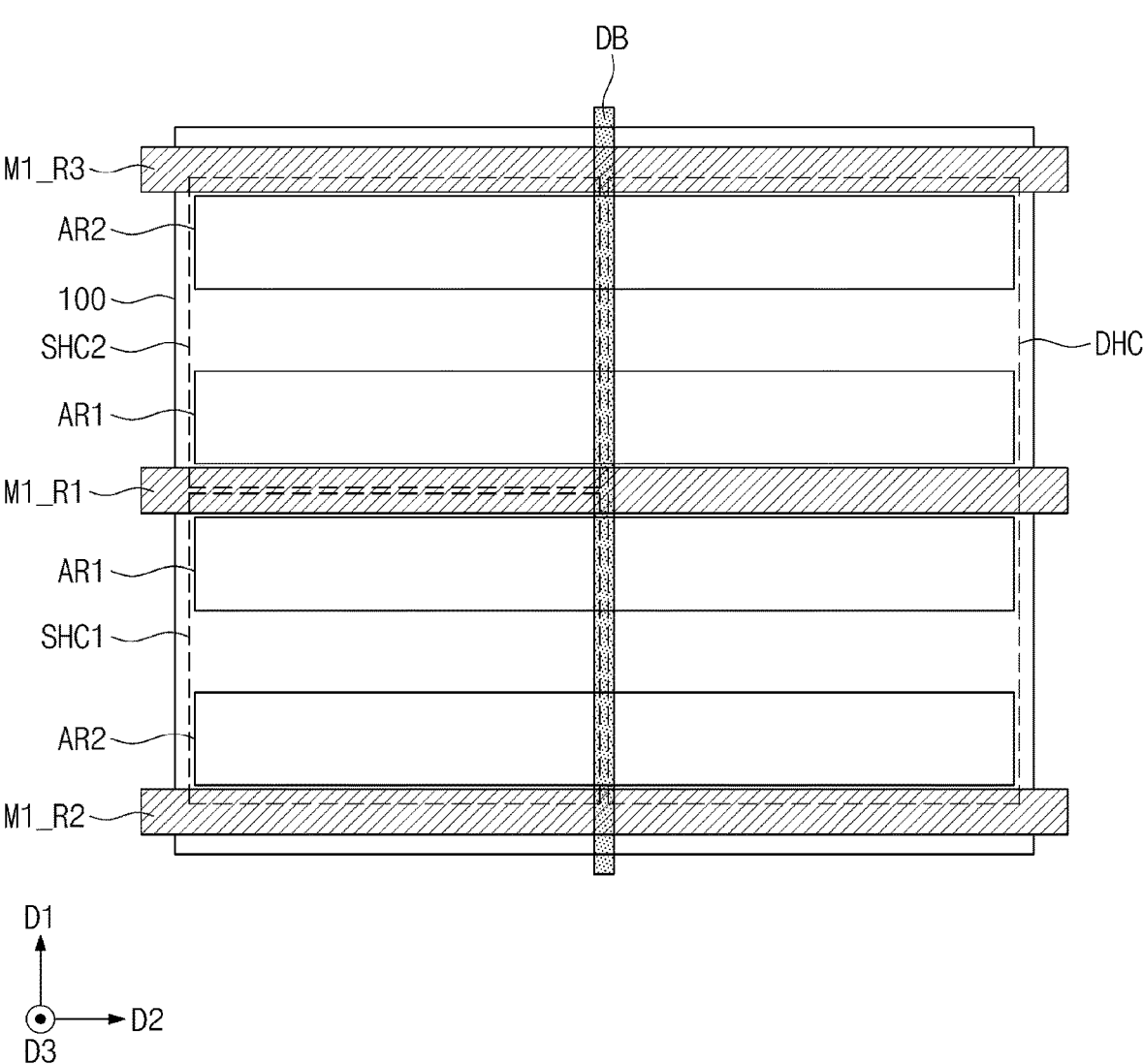

FIGS. 1 to 3 are conceptual diagrams illustrating logic cells of a semiconductor device according to an embodiment of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AR1 and one second active region AR2. One of the first and second active regions AR1 and AR2 may be a P-type metal oxide semiconductor field effect transistor (PMOSFET) region, and the other may be an N-type metal oxide semiconductor field effect transistor (NMOSFET) region. In other words, the single height cell SHC may have a complementary metal oxide semiconductor (CMOS) structure provided between the first and second power lines M1_R1 and M1_R2.

Each of the first and second active regions AR1 and AR2 may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The single height cell SHC may constitute a single logic cell. In the present specification, the logic cell may mean a logic device (e.g., AND logic, OR logic, XOR logic, XNOR logic, inverter, and so forth), which is configured to execute a specific function. In other words, the logic cell may include transistors constituting the logic device and interconnection lines connecting transistors with each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the second active regions AR2 may be adjacent to the second power line M1_R2. The other of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be defined as a second height HE2. The second height HE2 may be about two times the first height HE1 of FIG. 1. The pair of the first active regions AR1 of the double height cell DHC may be combined to serve as a single active region.

In an embodiment, the double height cell DHC as shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
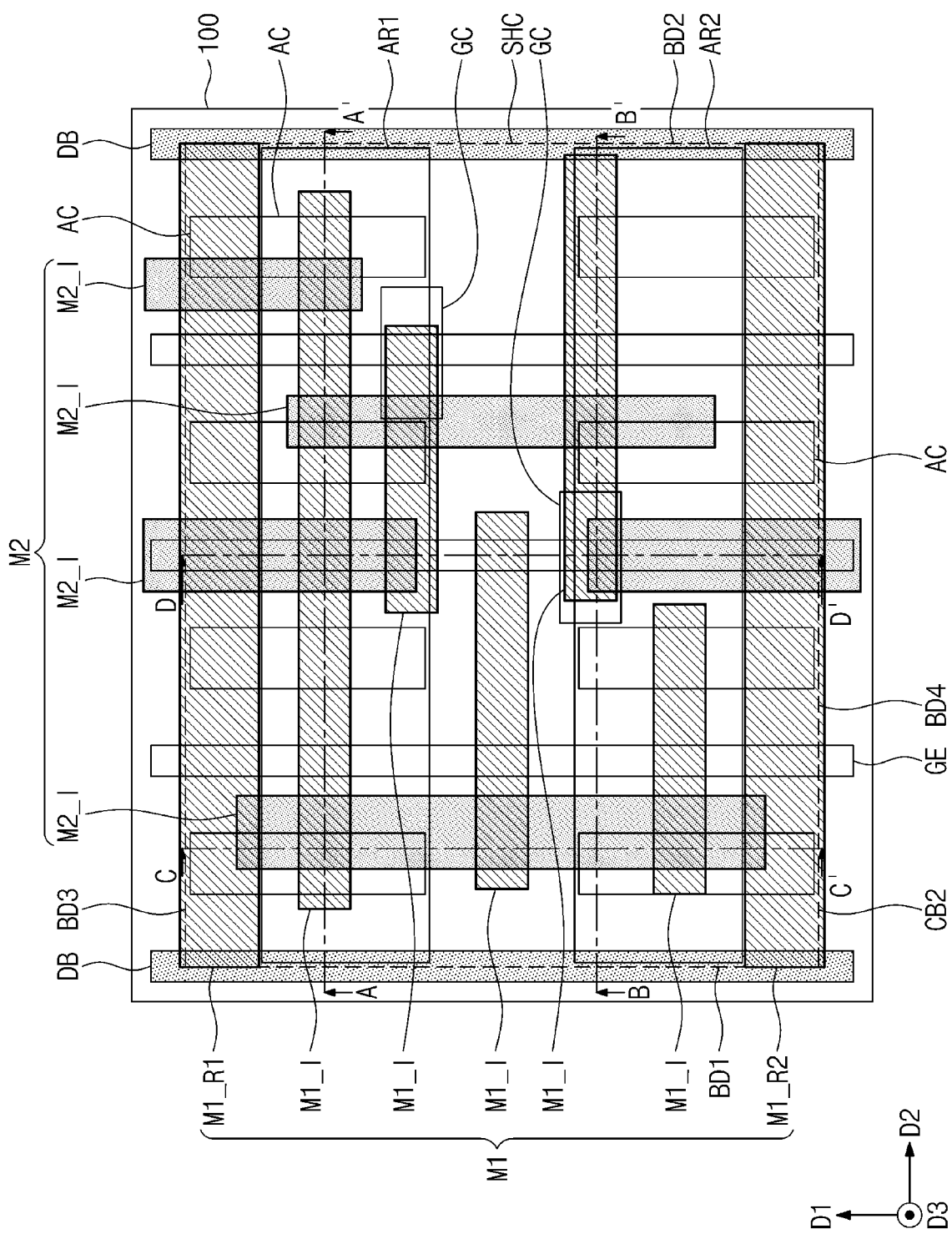
FIG. 4 is a plan view illustrating a semiconductor device according to an embodiment of the inventive concept.
Figure 5A:
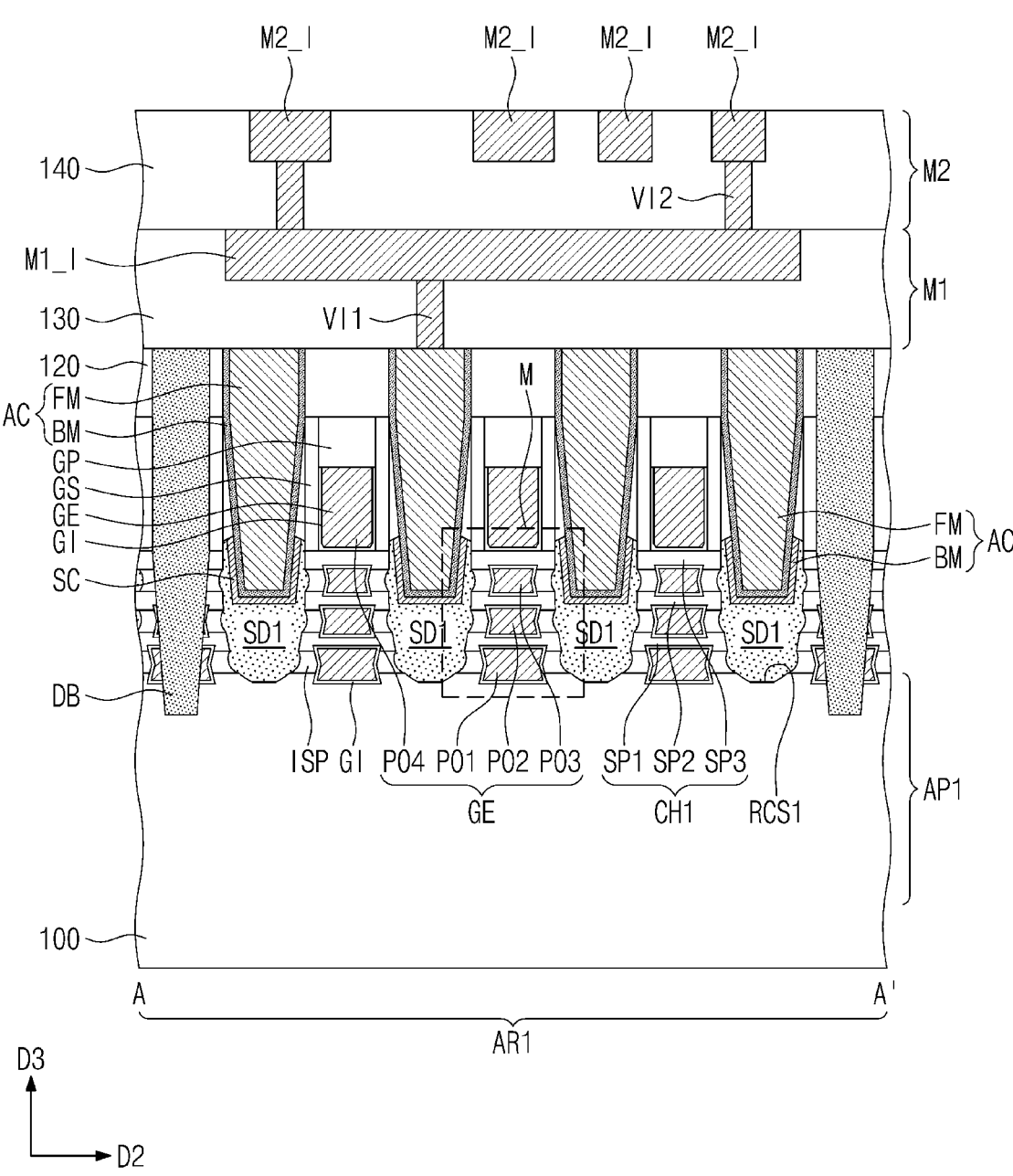
FIGS. 5A to 5D are sectional views taken along lines A-A', B-B', C-C', and D-D', respectively, of FIG. 4.
Figure 5B:
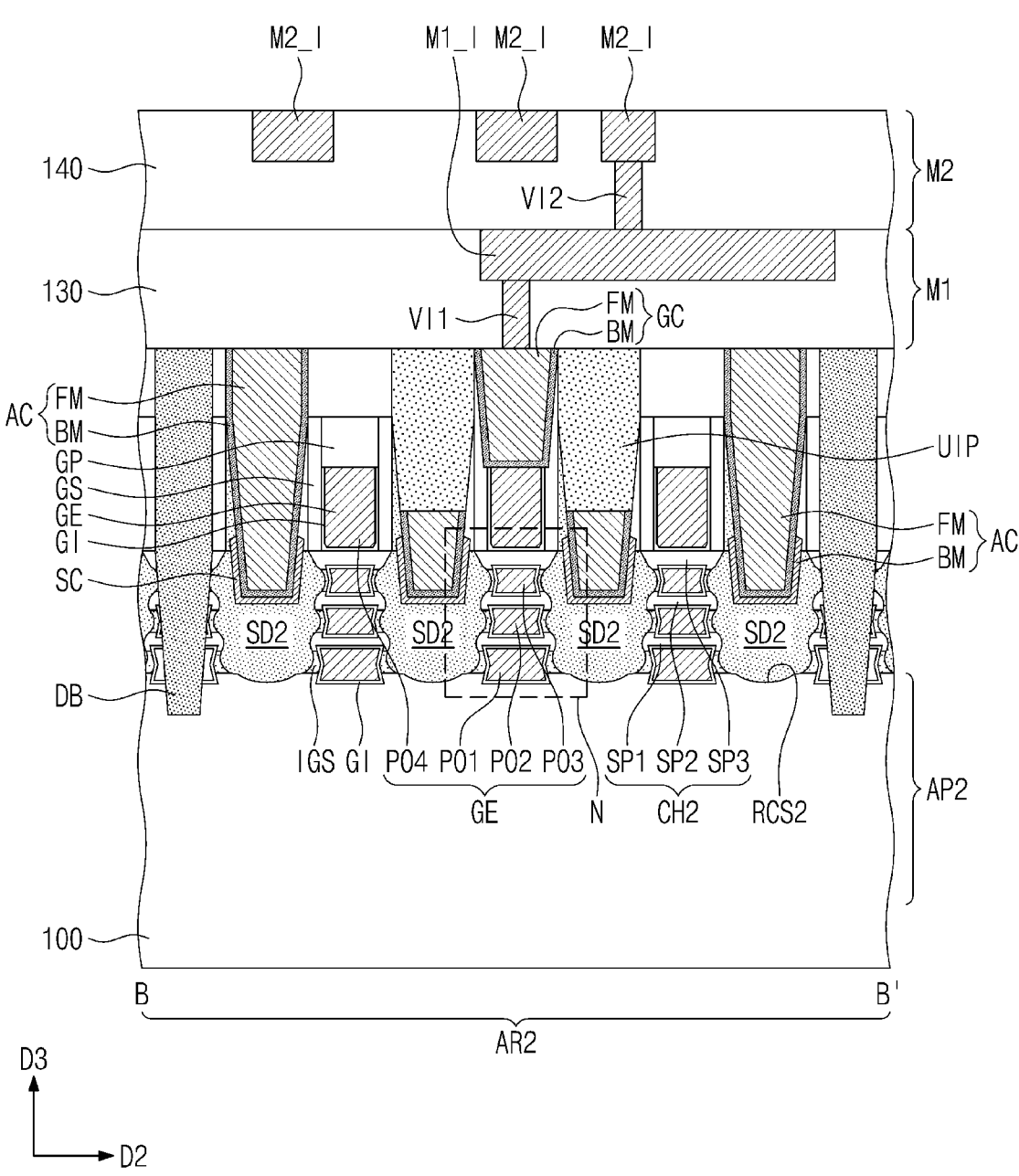
Figure 5C:
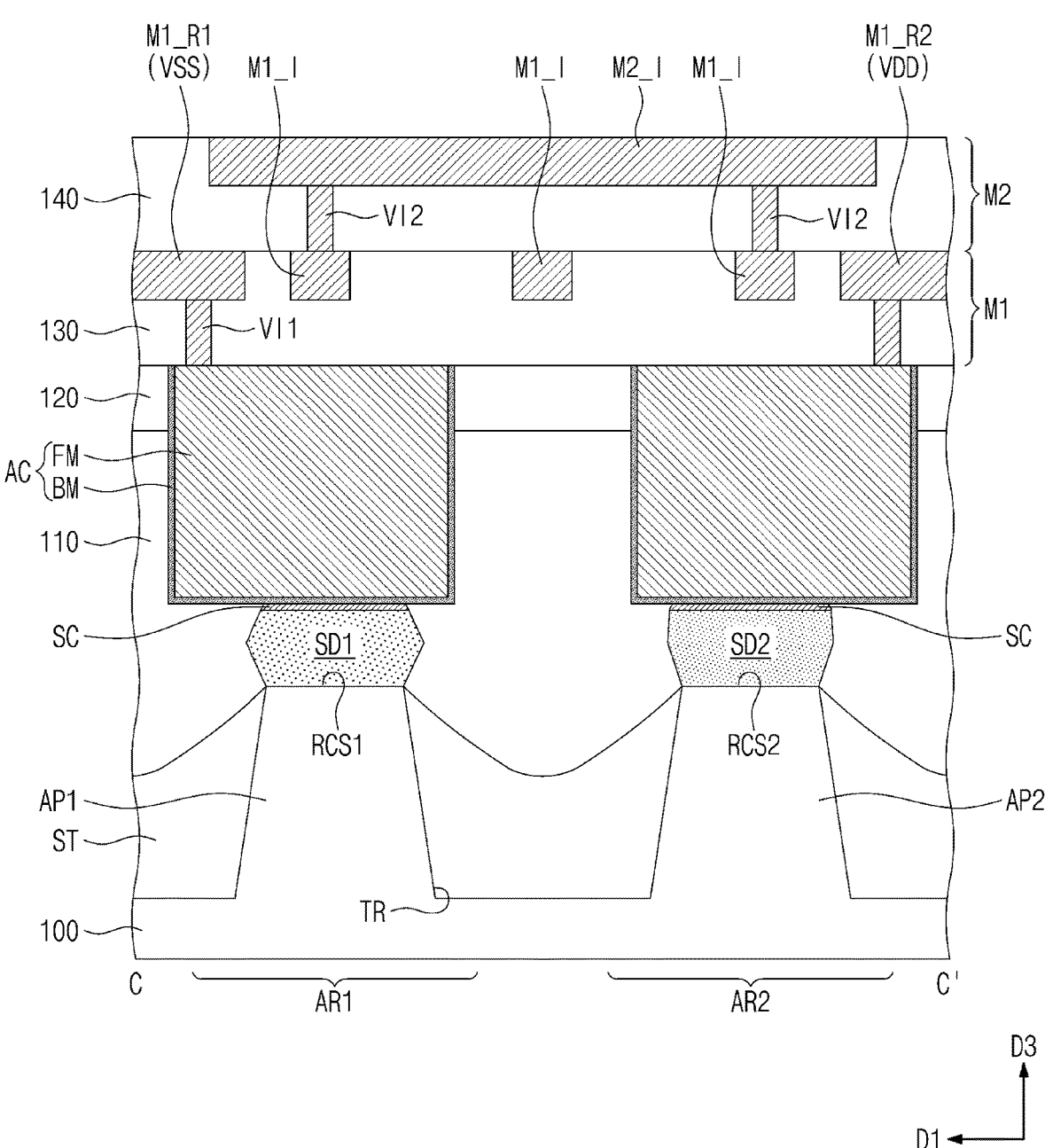

FIG. 4 is a plan view illustrating a semiconductor device according to an embodiment of the inventive concept. FIGS. 5A to 5D are sectional views taken along lines A-A', B-B', C-C', and D-D', respectively, of FIG. 4. FIG. 6A is an enlarged sectional view illustrating a portion 'M' of FIG. 5A. FIG. 6B is an enlarged sectional view illustrating a portion 'N' of FIG. 5B. The semiconductor device of FIGS. 4 and 5A to 5D may be an example of the single height cell SHC of FIG. 1.

Referring to FIGS. 4 and 5A to 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first active region AR1 and the second active region AR2. Each of the first and second active regions AR1 and AR2 may be extended in the second direction D2. In an embodiment, the first active region AR1 may be an NMOSFET region, and the second active region AR2 may be a PMOSFET region.

A first active pattern AP1 and a second active pattern AP2 may be defined by a trench TR, which is formed in an upper portion of the substrate 100. The first active pattern AP1 may be provided on the first active region AR1, and the second active pattern AP2 may be provided on the second active region AR2. The first and second active patterns AP1 and AP2 may be extended in the second direction D2. Each of the first and second active patterns AP1 and AP2 may be a vertically-protruding portion of the substrate 100. In an embodiment, the first and second active patterns AP1 and AP2 may be epitaxially grown from the substrate 100 or may be formed by etching the substrate 100.

A device isolation layer ST may be provided on the substrate 100. The device isolation layer ST may be provided to fill the trench TR. The device isolation layer ST may include or may be a silicon oxide layer. The device isolation layer ST may not cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), and silicon germanium (SiGe). For example, each of the first to third semiconductor patterns SP1, SP2, and SP3 may be formed of or include crystalline silicon (more specifically, single crystalline silicon). In an embodiment, the first to third semiconductor patterns SP1, SP2, and SP3 may be nanosheets that are stacked.

A plurality of first source/drain patterns SD1 may be provided on the first active pattern AP1. A plurality of first recesses RCS1 may be formed in an upper portion of the first active pattern AP1. The first source/drain patterns SD1 may be provided in the first recesses RCS1, respectively. The first source/drain patterns SD1 may be impurity regions of a first conductivity type (e.g., n-type). The first channel pattern CH1 may be interposed between each pair of the first source/drain patterns SD1. In other words, each pair of the first source/drain patterns SD1 may be connected with each other by the stacked first to third semiconductor patterns SP1, SP2, and SP3.

A plurality of second source/drain patterns SD2 may be provided on the second active pattern AP2. A plurality of second recesses RCS2 may be formed in an upper portion of the second active pattern AP2. The second source/drain patterns SD2 may be provided in the second recesses RCS2, respectively. The second source/drain patterns SD2 may be impurity regions of a second conductivity type (e.g., p-type). The second channel pattern CH2 may be interposed between each pair of the second source/drain patterns SD2. In other words, each pair of the second source/drain patterns SD2 may be connected with each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or include the same semiconductor material (e.g., Si) as the substrate 100. The second source/drain patterns SD2 may include a semiconductor material (e.g., SiGe) whose lattice constant is greater than the semiconductor material (e.g., Si) of the substrate 100. In this case, the pair of the second source/drain patterns SD2 may exert a compressive stress on the second channel pattern CH2 therebetween.

In an embodiment, the second source/drain pattern SD2 may have an uneven or embossing side surface. In other words, the side surface of the second source/drain pattern SD2 may have a wavy profile. The side surface of the second source/drain pattern SD2 may protrude toward first to third portions PO1, PO2, and PO3 of gate electrode GE to be described below.

Gate electrodes GE may be provided on the first and second channel patterns CH1 and CH2. Each of the gate electrodes GE may be extended in the first direction D1 to cross the first and second channel patterns CH1 and CH2. Each of the gate electrodes GE may vertically overlap the first and second channel patterns CH1 and CH2. The gate electrodes GE may be arranged at a first pitch in the second direction D2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
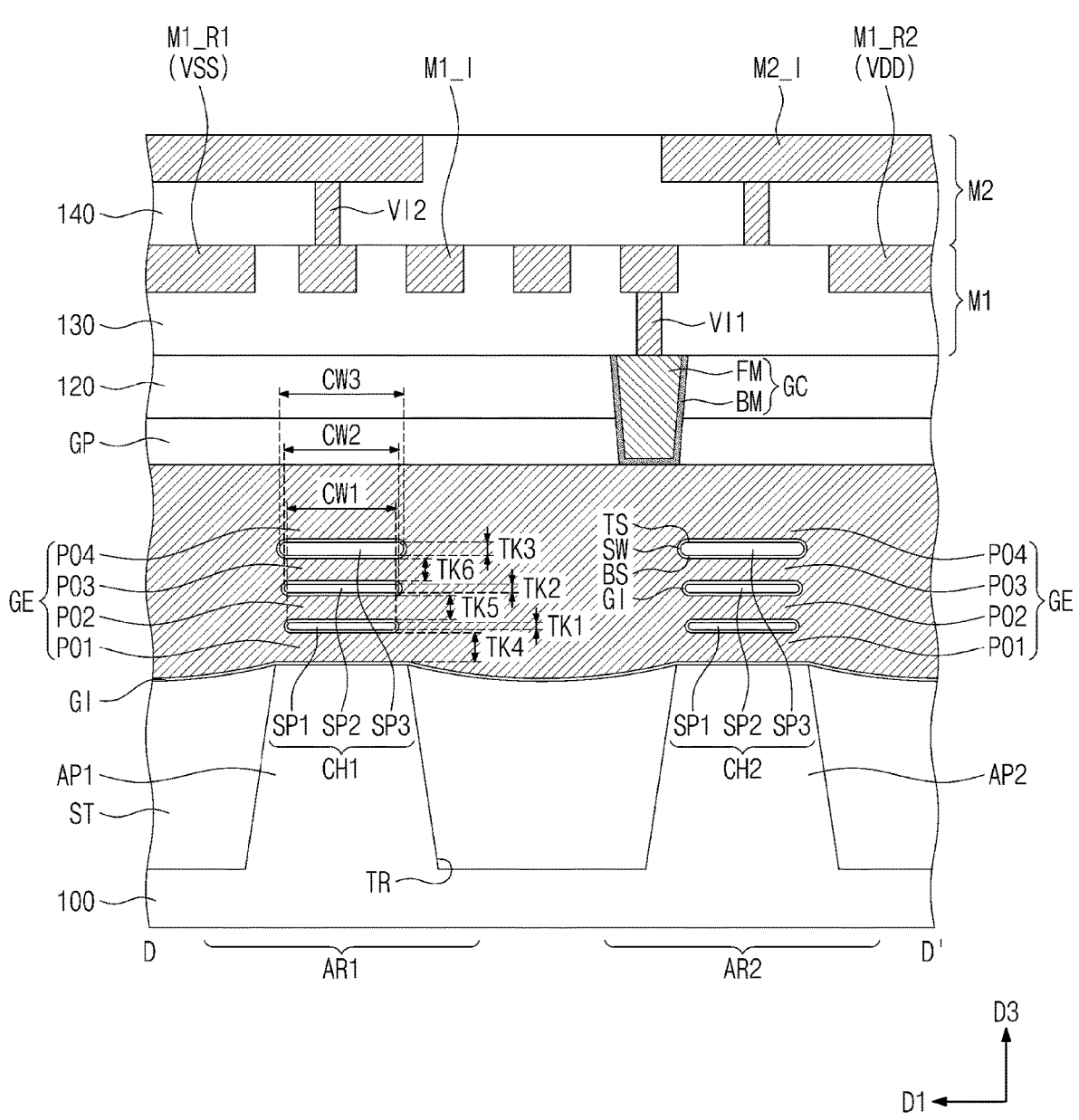
Figure 6A:
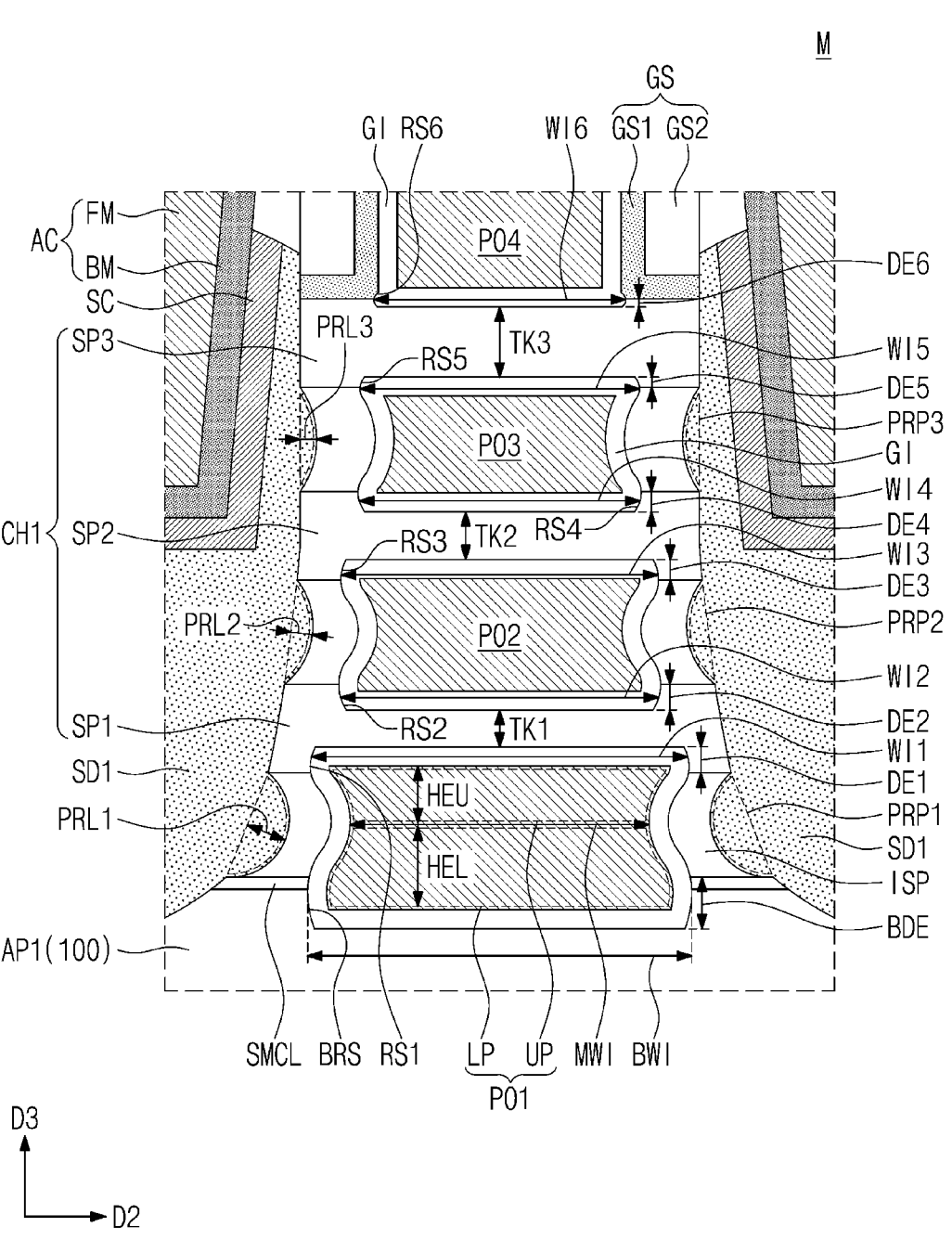
FIG. 6A is an enlarged sectional view illustrating a portion 'M' of FIG. 5A.
Figure 6B:
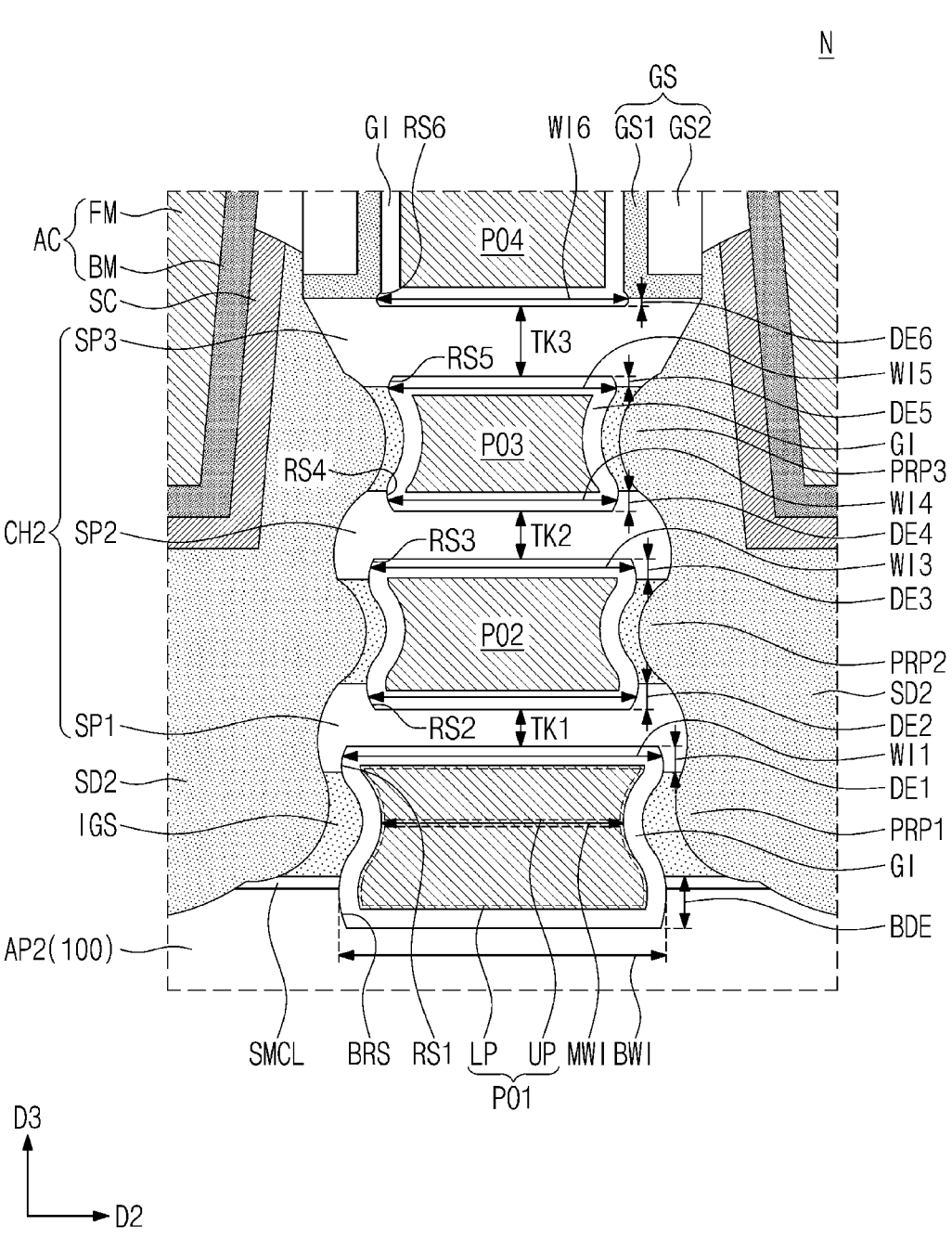
FIG. 6B is an enlarged sectional view illustrating a portion 'N' of FIG. 5B.

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIGS. 4 and 5A to 5D, inner spacers ISP may be provided on the first active region AR1 to be respectively interposed between the first to third portions PO1, PO2, and PO3 of the gate electrode GE and the first source/drain pattern SD1. Each of the first to third portions PO1, PO2, and PO3 of the gate electrode GE may be spaced apart from the first source/drain pattern SD1 with the inner spacer ISP interposed therebetween. The inner spacer ISP may prevent a leakage current from the gate electrode GE.

Inner gate spacers IGS may be provided on the second active region AR2 and may respectively interposed between the first to third portions PO1, PO2, and PO3 of the gate electrode GE and the second source/drain pattern SD2. Each of the first to third portions PO1, PO2, and PO3 of the gate electrode GE may be spaced apart from the second source/drain pattern SD2 with the inner gate spacer IGS interposed therebetween. In an embodiment, the inner gate spacers IGS may be omitted.

A pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, and SiN. In another embodiment, the gate spacers GS may be a multi-layered structure, which is formed of or includes at least two different materials selected from SiCN, SiCON, and SiN.

In an embodiment, as shown in FIG. 6A, the gate spacer GS may include a first spacer GS1 on a side surface of the gate electrode GE and a second spacer GS2 on the first spacer GS1. Each of the first and second spacers GS1 and GS2 may be formed of or include at least one of silicon-containing insulating materials. For example, the first spacer GS1 may be formed of or include a silicon-containing low-k dielectric material (e.g., SiCON). The second spacer GS2 may be formed of or include a silicon-containing insulating material (e.g., SiN) having a good etch resistant property. The second spacer GS2 may be used as an etch stop layer in a process of forming active contacts AC, which will be described below. The second spacer GS2 may be used to form the active contacts AC in a self-aligned manner.

Referring back to FIGS. 4 and 5A to 5D, a gate capping pattern GP may be provided on the gate electrode GE. The gate capping pattern GP may be extended along the gate electrode GE or in the first direction D1. The gate capping pattern GP may be formed of or include a material having etch selectivity with respect to first and second interlayer insulating layers 110 and 120, which will be described below. In detail, the gate capping pattern GP may be formed of or include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3 (See FIG. 5D). The gate insulating layer GI may cover a top surface of the device isolation layer ST below the gate electrode GE.

In an embodiment, the gate insulating layer GI may include or may be a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or include at least one of high-k dielectric materials whose dielectric constants are higher than that of silicon oxide. As an example, the high-k dielectric layer may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and oxygen (O).

The ferroelectric layer may further include dopants or may be doped with dopants. For example, the dopants may include or may be at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The kind of the dopants in the ferroelectric layer may vary depending on a ferroelectric material included in the ferroelectric layer.

In the case where the ferroelectric layer includes or is hafnium oxide, the dopants in the ferroelectric layer may include or may be at least one of, for example, gadolinium (Gd), silicon (Si), zirconium (Zr), aluminum (Al), and yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide, and a high-k metal oxide. The high-k metal oxide, which can serve as the paraelectric layer, may include at least one of, for example, hafnium oxide, zirconium oxide, and aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include or may be a single ferroelectric layer. As another example, the gate insulating layer GI may include or may be formed of a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include or may be a metal nitride layer. For example, the first metal pattern may include or may be a layer that is composed of nitrogen (N) and at least one metallic material, which is selected from the group consisting of titanium (Ti), tantalum (Ta), aluminum (Al), tungsten (W), and molybdenum (Mo). In an embodiment, the first metal pattern may further include carbon (C). The first metal pattern may include or may be formed of a plurality of work function metal layers which are stacked on each other.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include or may be a silicon oxide layer.

The single height cell SHC may have a first border BD1 and a second border BD2, which are opposite to each other in the second direction D2. The first and second borders BD1 and BD2 may be extended in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at opposite sides of the single height cell SHC. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the single height cell SHC from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at opposite sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, and cobalt silicide.

Gate contacts GC may be provided to penetrate the second interlayer insulating layer 120 and the gate capping pattern GP and to be electrically connected to the gate electrodes GE, respectively. When viewed in a plan view, the gate contacts GC may be disposed to overlap the first and second active regions AR1 and AR2, respectively. As an example, the gate contact GC may be provided on the second active pattern AP2 (e.g., see FIG. 5B).

In an embodiment, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than bottom surface of the gate contact GC, by the upper insulating pattern UIP. Accordingly, it may be possible to prevent the gate contact GC and the active contact AC, which are adjacent to each other, from contacting each other and thereby to prevent a short circuit therebetween from occurring. The term "contact," as used herein, refers to a direct connection (i.e., touching) unless the context indicates otherwise.

Each of the active and gate contacts AC and GC may include or may be formed of a conductive pattern FM and a barrier pattern BM enclosing the conductive pattern FM. For example, the conductive pattern FM may be formed of or include at least one of metals (e.g., aluminum, copper, tungsten, molybdenum, and cobalt). The barrier pattern BM may be provided to cover side and bottom surfaces of the conductive pattern FM. In an embodiment, the barrier pattern BM may include or may be formed of a metal layer and a metal nitride layer. The metal layer may be formed of or include at least one of titanium, tantalum, tungsten, nickel, cobalt, and platinum. The metal nitride layer may be formed of or include at least one of titanium nitride (TiN), tantalum nitride (TaN), tungsten nitride (WN), nickel nitride (NiN), cobalt nitride (CoN), and platinum nitride (PtN).

A first metal layer M1 may be provided in the third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may be extended in the second direction D2 and parallel to each other.

In detail, the first and second power lines M1_R1 and M1_R2 may be respectively provided on the third and fourth borders BD3 and BD4 of the single height cell SHC. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected with each other through the first via VI1. The gate contact GC and the interconnection line of the first metal layer M1 may be electrically connected with each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected with each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metals (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells (i.e., serves to electrically connect the cells with each other).

Hereinafter, the first channel pattern CH1 and the gate electrode GE on the first active pattern AP1 will be described in more detail with reference to FIG. 6A.

Each of the first to third semiconductor patterns SP1, SP2, and SP3 of the first channel pattern CH1 may include channel recesses, which are formed in lower and upper portions thereof. For example, the lower portion of the first semiconductor pattern SP1 may include a first channel recess RS1, and the upper portion of the first semiconductor pattern SP1 may include a second channel recess RS2. The lower portion of the second semiconductor pattern SP2 may include a third channel recess RS3, and the upper portion of the second semiconductor pattern SP2 may include a fourth channel recess RS4. The lower portion of the third semiconductor pattern SP3 may include a fifth channel recess RS5, and the upper portion of the third semiconductor pattern SP3 may include a sixth channel recess RS6. In an embodiment, the upper portion of the first active pattern AP1 may include a body recess BRS.

The recess depths of the channel recesses RS1 to RS6 may decrease or may gradually decrease as a distance from a lower tier increases in a direction toward an upper tier. In the present application, the lower tier may be a level that is closer to the top surface of the substrate 100. The upper tier may be a level that is further from the top surface of the substrate 100. For example, when two semiconductor patterns adjacent to each other are referred to, a lower semiconductor pattern is closer to the top surface of the substrate 100 among the two semiconductor patterns, and it is referred to as being disposed at a lower tier, for example. An upper semiconductor pattern of the two semiconductor patterns is further from the top surface of the substrate 100, and it is referred to as being disposed at an upper tier, for example. The recess depth may be a distance from an interface between the semiconductor pattern SP1, SP2, or SP3 and the inner spacer ISP to the innermost surface of each of the channel recesses RS1 to RS6.

As a distance from the lower tier in a direction toward the upper tier increases, the recess widths of the channel recesses RS1 to RS6 in the second direction D2 may decrease or may gradually decrease. Each of the channel recesses RS1 to RS6 may have a rounded side surface. Thus, the recess width may be defined as the largest width of each of the channel recesses RS1 to RS6 in the second direction D2.

For example, a second recess depth DE2 of the second channel recess RS2 may be smaller than a first recess depth DE1 of the first channel recess RS1. A third recess depth DE3 of the third channel recess RS3 may be smaller than the second recess depth DE2 of the second channel recess RS2. A fourth recess depth DE4 of the fourth channel recess RS4 may be smaller than the third recess depth DE3 of the third channel recess RS3. A fifth recess depth DE5 of the fifth channel recess RS5 may be smaller than the fourth recess depth DE4 of the fourth channel recess RS4. A sixth recess depth DE6 of the sixth channel recess RS6 may be smaller than the fifth recess depth DE5 of the fifth channel recess RS5.

A second recess width WI2 of the second channel recess RS2 may be smaller than a first recess width WI1 of the first channel recess RS1. A third recess width WI3 of the third channel recess RS3 may be smaller than the second recess width WI2 of the second channel recess RS2. A fourth recess width WI4 of the fourth channel recess RS4 may be smaller than the third recess width WI3 of the third channel recess RS3. A fifth recess width WI5 of the fifth channel recess RS5 may be smaller than the fourth recess width WI4 of the fourth channel recess RS4. A sixth recess width WI6 of the sixth channel recess RS6 may be smaller than the fifth recess width WI5 of the fifth channel recess RS5.

The body recess BRS may have a recess width that is larger than the channel recesses RS1 to RS6. The body recess BRS may have a recess depth that is larger than the channel recesses RS1 to RS6. For example, a recess depth BDE of the body recess BRS may be larger than the first recess depth DE1 of the first channel recess RS1. A recess width BWI of the body recess BRS may be larger than the first recess width WI1 of the first channel recess RS1.

Due to the channel recesses RS1 to RS6, each of the first to third semiconductor patterns SP1, SP2, and SP3 may have a dumbbell shape. In other words, a thickness of a center portion of each of the first to third semiconductor patterns SP1, SP2, and SP3 may be smaller than a thickness of a side portion, which is connected to the first source/drain pattern SD1.

As a distance from the lower tier in a direction toward the upper tier increases, a thickness of the center portion of each of the first to third semiconductor patterns SP1, SP2, and SP3 may increase or may gradually increase. For example, a second thickness TK2 of the second semiconductor pattern SP2 may be larger than a first thickness TK1 of the first semiconductor pattern SP1. A third thickness TK3 of the third semiconductor pattern SP3 may be larger than the second thickness TK2 of the second semiconductor pattern SP2.

Referring back to FIG. 5D, a width of each of the first to third semiconductor patterns SP1, SP2, and SP3 in the first direction D1 may be increased or may be gradually increased from a lower tier to an upper tier. For example, a second channel width CW2 of the second semiconductor pattern SP2 may be larger than a first channel width CW1 of the first semiconductor pattern SPL. A third channel width CW3 of the third semiconductor pattern SP3 may be larger than the second channel width CW2 of the second semiconductor pattern SP2.

Referring back to FIG. 6A, each of the first to third portions PO1, PO2, and PO3 of the gate electrode GE may have a sandglass shape. In other words, a width of each of the first to third portions PO1, PO2, and PO3 in the second direction D2 may decrease and then increase, as a distance from its upper portion in a direction toward its lower portion increases. Each of the first to third portions PO1, PO2, and PO3 may have a minimum width MWI between upper and lower portions UP and LP thereof.

As a distance from the lower tier in a direction toward the upper tier increases, sizes or volumes of the first to third portions PO1, PO2, and PO3 may decrease or may gradually decrease. For example, the minimum width MWI of the second portion PO2 may be smaller than the minimum width MWI of the first portion PO1. The minimum width MWI of the third portion PO3 may be smaller than the minimum width MWI of the second portion PO2. For example, referring to FIG. 5D, a thickness TK5 of the second portion PO2 may be smaller than a thickness TK4 of the first portion PO1. A thickness TK6 of the third portion PO3 may be smaller than the thickness TK5 of the second portion PO2.

Referring back to FIG. 6A, each of the first to third portions PO1, PO2, and PO3 may include the lower portion LP and the upper portion UP. Each of the first to third portions PO1, PO2, and PO3 may have the minimum width MWI at a level corresponding to an interface between the lower portion LP and the upper portion UP. A volume of the lower portion LP of each of the first to third portions PO1, PO2, and PO3 may be larger than a volume of the upper portion UP.

As an example, a volume of the lower portion LP of the first portion PO1 may be larger than a volume of the upper portion UP. The largest width of the lower portion LP of the first portion PO1 may be larger than the largest width of the upper portion UP. A height HEL of the lower portion LP of the first portion PO1 may be larger than a height HEU of the upper portion UP. This is because the body recess BRS is formed to have a size larger than the first channel recess RS1.

A semiconductor layer SMCL may be interposed between the lowermost one of the inner spacers ISP and the first active pattern AP1. The semiconductor layer SMCL may be an epitaxial layer, which is grown from a top surface of the first active pattern AP1. The semiconductor layer SMCL may be formed of or include one of silicon (Si), germanium (Ge), and silicon-germanium (SiGe). In the case where the semiconductor layer SMCL includes or is formed of silicon (Si), there may be no observable interface between the semiconductor layer SMCL and the first active pattern AP1. The semiconductor layer SMCL may contribute to the formation of the body recess BRS that is larger than the channel recesses RS1 to RS6. For example, a part of the semiconductor layer SMCL may be oxidized during a time when an upper portion of the active pattern AP1 or AP2 is oxidized in a process of forming the channel recesses RS1 to RS6.

The first source/drain pattern SD1 may include first to third protruding portions PRP1, PRP2, and PRP3, which are respectively formed to protrude toward the first to third portions PO1, PO2, and PO3 of the gate electrode GE. As a distance from the lower tier in a direction toward the upper tier increases, the protruding lengths of the first to third protruding portions PRP1, PRP2, and PRP3 may decrease or may gradually decrease. For example, a second protruding length PRL2 of the second protruding portion PRP2 may be smaller than a first protruding length PRL1 of the first protruding portion PRP1. A third protruding length PRL3 of the third protruding portion PRP3 may be smaller than the second protruding length PRL2 of the second protruding portion PRP2.

As a distance from the lower tier in a direction toward the upper tier increases, widths of the inner spacers ISP in the second direction D2 may increase or may gradually increase. This is because, as a distance from the lower tier in a direction toward the upper tier increases, protruding lengths of the first to third protruding portions PRP1, PRP2, and PRP3 decrease (i.e., PRL1>PRL2>PRL3).

According to an embodiment of the inventive concept, since each of the first to third semiconductor patterns SP1, SP2, and SP3 have channel recesses that are respectively formed in upper and lower portions thereof, an effective channel length (ECL) thereof may be increased. In an embodiment, the channel recesses may increase channel lengths by recess depths between two adjacent first and second source/drain patterns SD1 and SD2. Thus, it may be possible to prevent a short channel effect (e.g., a leakage current and a DIBL issue). Furthermore, according to an embodiment of the inventive concept, it may be possible to prevent a hot carrier effect and thereby to improve reliability characteristics of the semiconductor device.

Since the body recess BRS is formed in the upper portion of the first active pattern AP1, a channel region, which is formed in the upper portion of the first active pattern AP1, may have a three-dimensional structure. Accordingly, it may be possible to increase an effective channel length (ECL) of the upper portion of the first active pattern AP1 and to suppress a short channel effect. In addition, it may be possible to prevent or suppress a leakage current issue from occurring in the upper portion of the first active pattern APL.

The second channel pattern CH2 and the gate electrode GE on the second active pattern AP2 will be described in more detail with reference to FIG. 6B.

Each of the first to third semiconductor patterns SP1, SP2, and SP3 of the second channel pattern CH2 may include channel recesses, which are formed in lower and upper portions thereof. The channel recesses RS1 to RS6 of the first to third semiconductor patterns SP1, SP2, and SP3 may be provided to have substantially the same features as the channel recesses RS1 to RS6 as previously described with reference to FIG. 6A.

In an embodiment, the upper portion of the second active pattern AP2 may include the body recess BRS. The body recess BRS may be provided to have substantially the same features as the body recess BRS as previously described with reference to FIG. 6A.

Due to the channel recesses RS1 to RS6, each of the first to third semiconductor patterns SP1, SP2, and SP3 may have a dumbbell shape. The first to third semiconductor patterns SP1, SP2, and SP3 may be provided to have substantially the same features as the first to third semiconductor patterns SP1, SP2, and SP3 as previously described with reference to FIG. 6A.

Each of the first to third portions PO1, PO2, and PO3 of the gate electrode GE may have a sandglass shape. Each of the first to third portions PO1, PO2, and PO3 may include the lower portion LP and the upper portion UP, which has a volume smaller than the lower portion LP. The first to third portions PO1, PO2, and PO3 may be provided to have substantially the same features as the first to third portions PO1, PO2, and PO3 as previously described with reference to FIG. 6A.

The semiconductor layer SMCL may be interposed between the lowermost one of the inner gate spacers IGS and the second active pattern AP2. The semiconductor layer SMCL may be provided to have substantially the same features as the semiconductor layer SMCL as previously described with reference to FIG. 6A.

The second source/drain pattern SD2 may include the first to third protruding portions PRP1, PRP2, and PRP3, which are respectively formed to protrude toward the first to third portions PO1, PO2, and PO3 of the gate electrode GE. Each of the first to third protruding portions PRP1, PRP2, and PRP3 may be covered with the inner gate spacer IGS. The first to third protruding portions PRP1, PRP2, and PRP3 may be provided to have substantially the same features as the first to third protruding portions PRP1, PRP2, and PRP3 as previously described with reference to FIG. 6A.

FIG. 6A illustrates an example, in which the three-dimensional transistor is an NMOSFET, and FIG. 6B illustrates an example in which the three-dimensional transistor is a PMOSFET. However, the inventive concept is not limited to this example, and in an embodiment, the three-dimensional transistor illustrated in FIG. 6A may be applied to the PMOSFET. Similarly, the three-dimensional transistor illustrated in FIG. 6B may be applied to the NMOSFET.

FIGS. 7A to 12C are sectional views illustrating a method of fabricating a semiconductor device according to an embodiment of the inventive concept. In detail, FIGS. 7A, 8A, 9A, 10A, 11A, and 12A are sectional views taken along the line A-A' of FIG. 4. FIGS. 9B, 10B, 11B, and 12B are sectional views taken along the line B-B' of FIG. 4. FIGS. 9C and 10C are sectional views taken along the line C-C' of FIG. 4. FIGS. 7B, 8B, 11C, and 12C are sectional views taken along the line D-D' of FIG. 4. FIG. 25 is a flowchart of fabricating the semiconductor device according to an embodiment of the inventive concept.

Figure 7A:
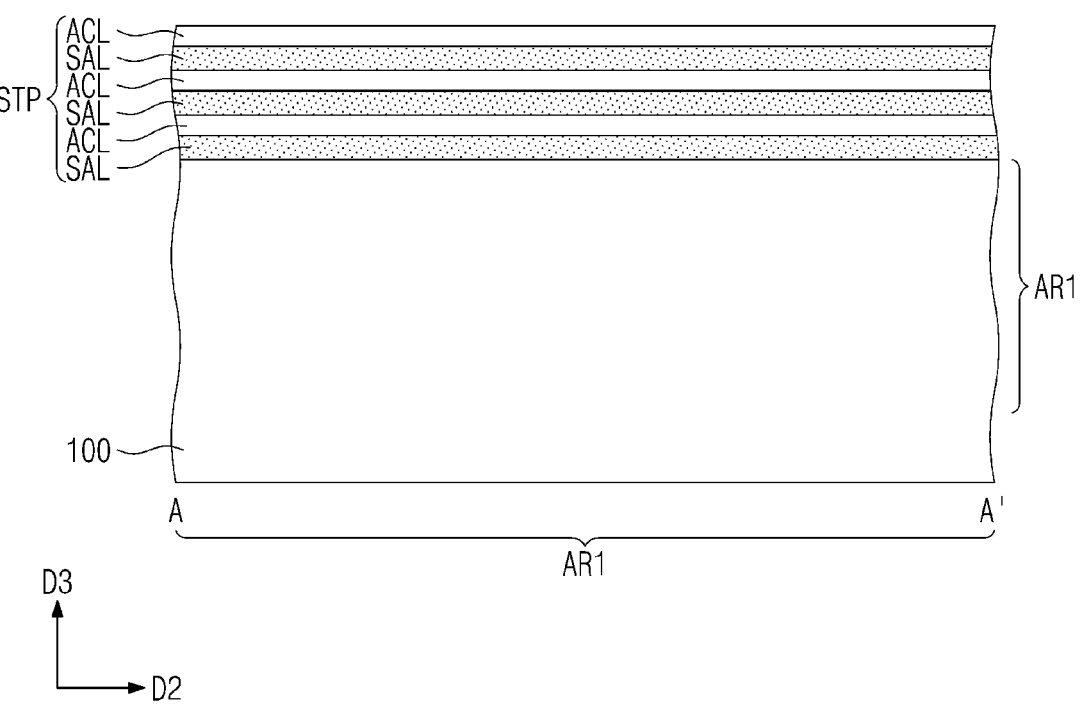
FIGS. 7A to 7B, 8A to 8B, 9A to 9C, 10A to 10C, 11A to 11C, and 12A to 12C are sectional views illustrating a method of fabricating a semiconductor device according to an embodiment of the inventive concept.
Figure 7B:
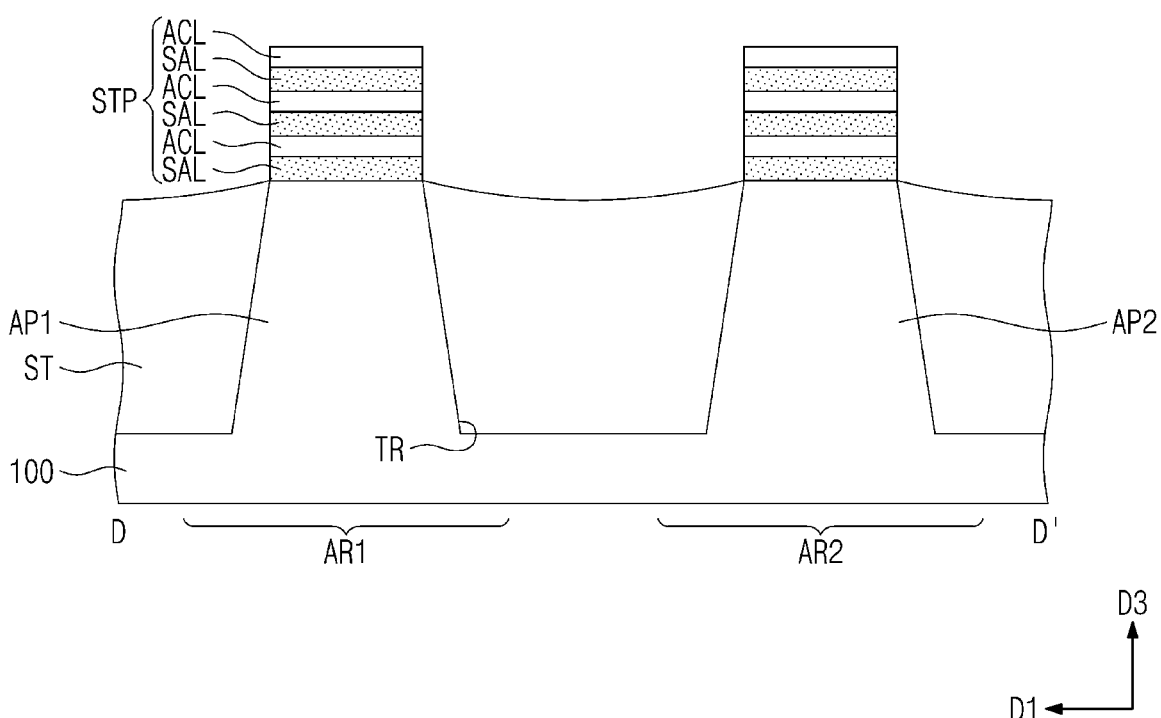

Referring to FIGS. 7A and 7B and 25, the substrate 100 including the first and second active regions AR1 and AR2 may be provided. Active layers ACL and sacrificial layers SAL may be alternately stacked on the substrate 100. The active layers ACL may be formed of or include one of silicon (Si), germanium (Ge), and silicon germanium (SiGe), and the sacrificial layers SAL may be formed of or include one of silicon (Si), germanium (Ge), and silicon germanium (SiGe). In an embodiment, the active layers ACL and the sacrificial layers SAL may be different in material.

The sacrificial layer SAL may be formed of or include at least one of materials having etch selectivity with respect to the active layer ACL. For example, the active layers ACL may include or may be formed of silicon (Si), and the sacrificial layers SAL may be formed of or include silicon-germanium (SiGe). A germanium concentration of each of the sacrificial layers SAL may range from 10 at % to 30 at %.

Mask patterns may be respectively formed on the first and second active regions AR1 and AR2 of the substrate 100. The mask patterns may be line- or bar-shaped patterns that are extended in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2 (step 101). The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 8A:
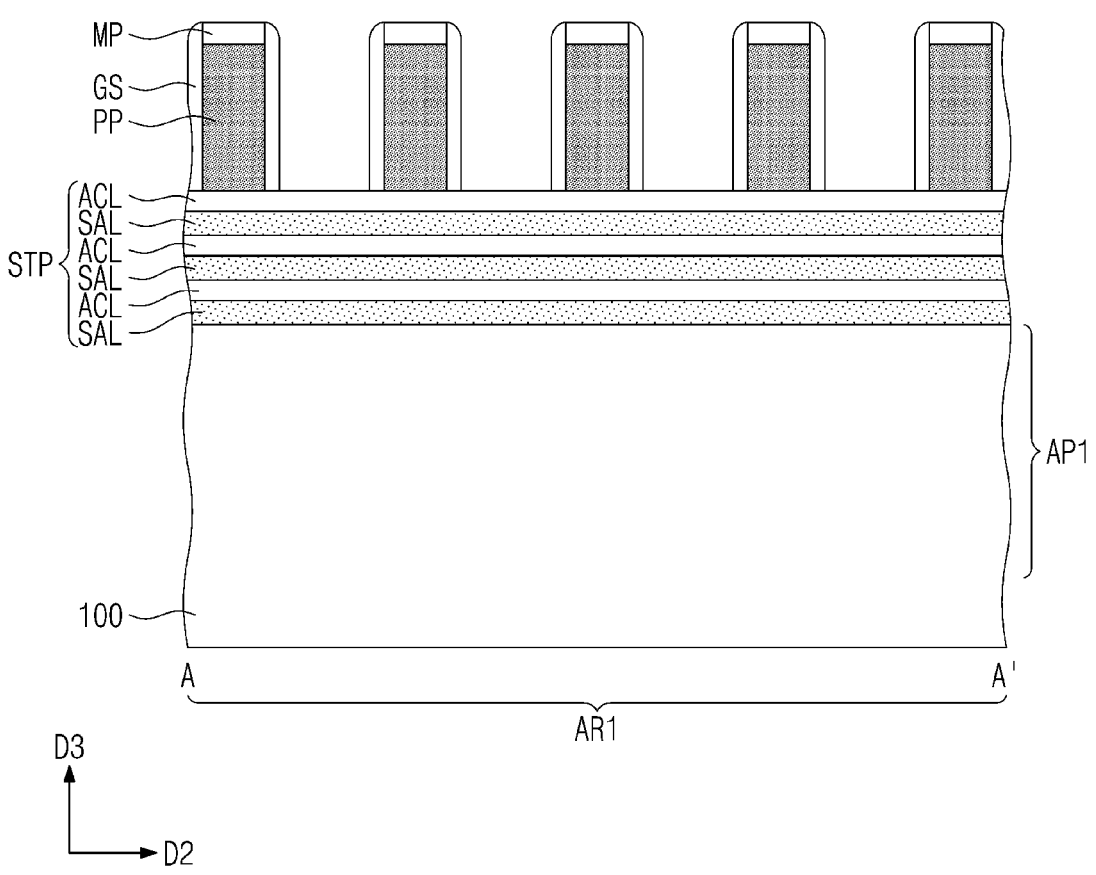
Figure 8B:
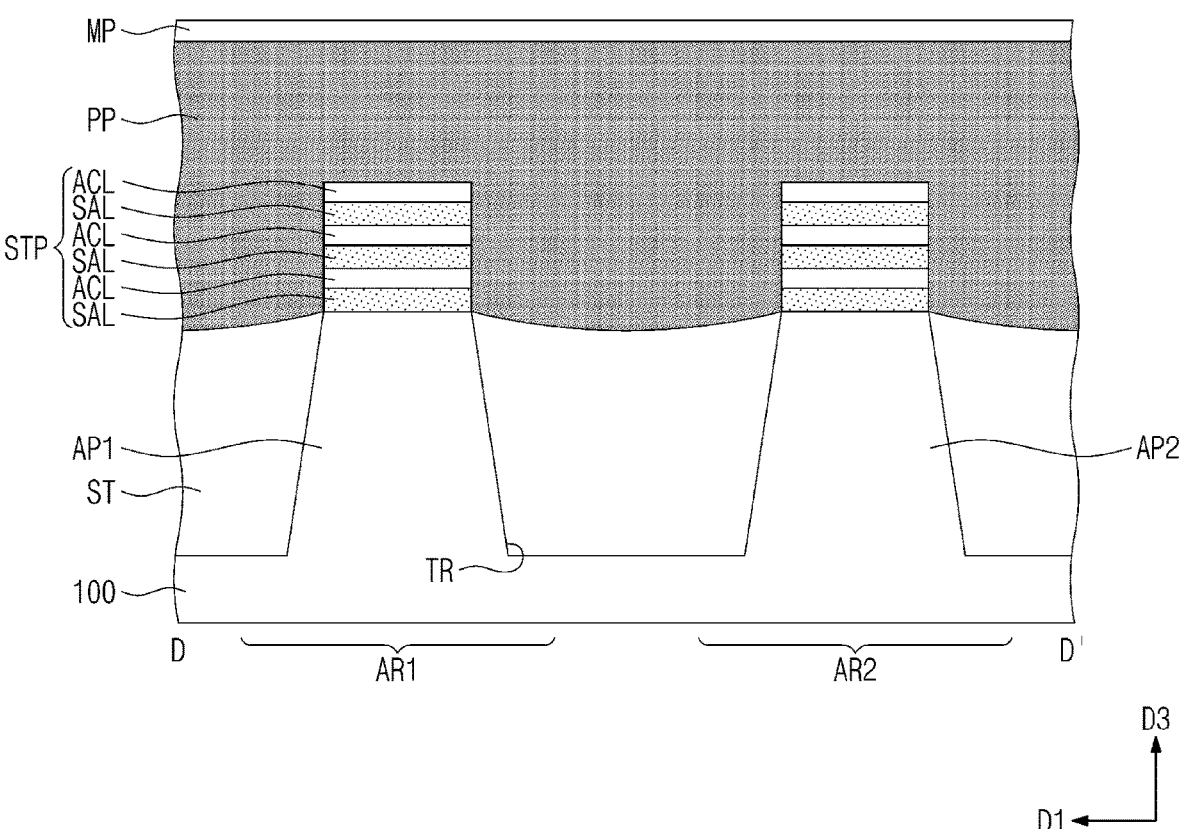
Figure 9A:
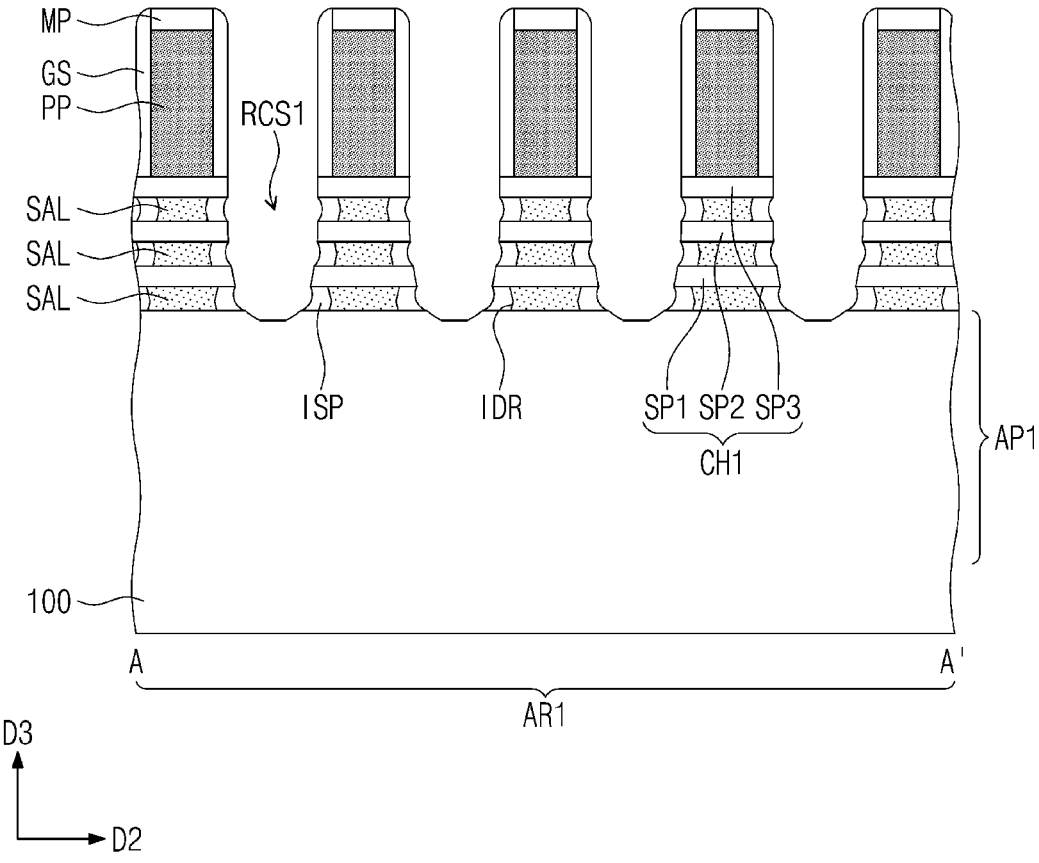
Figure 9B:
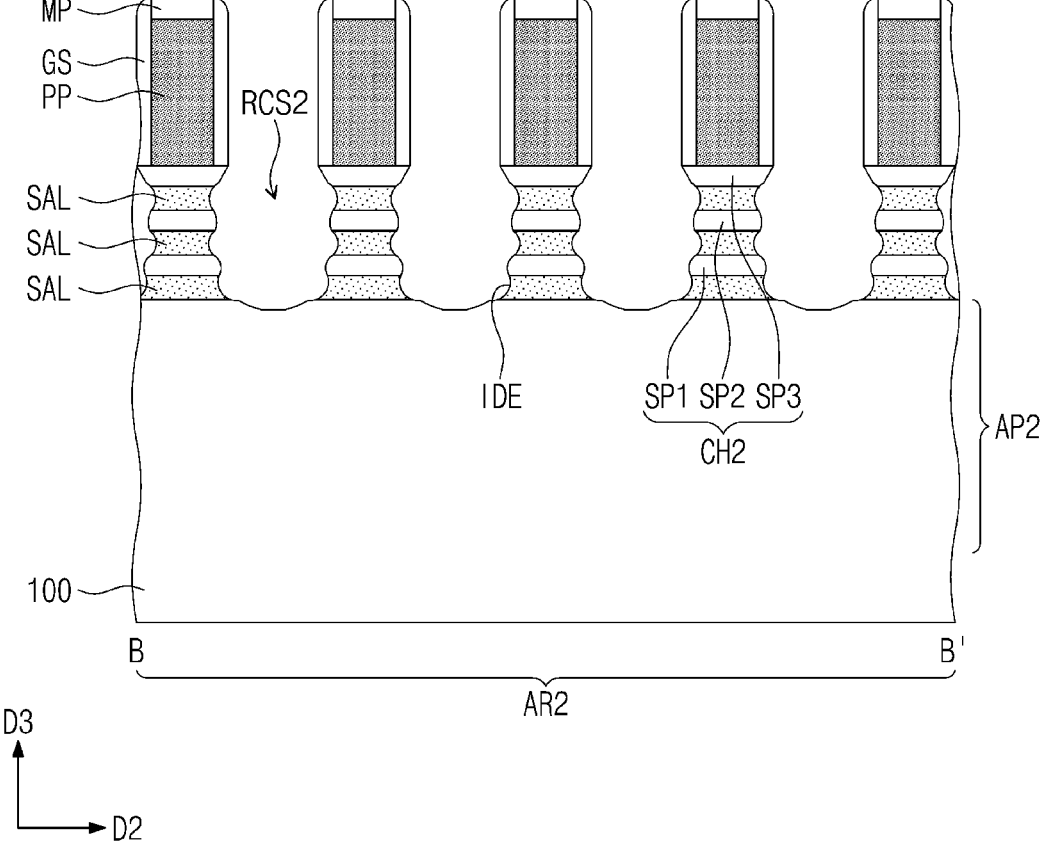
Figure 9C:
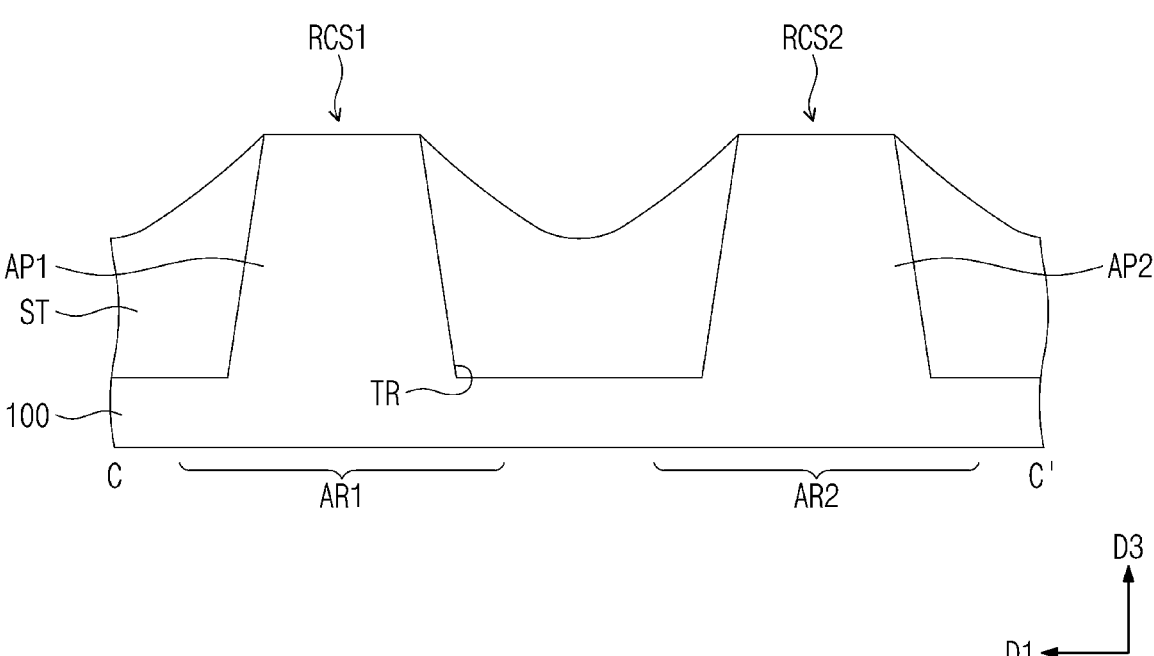
Figure 10A:
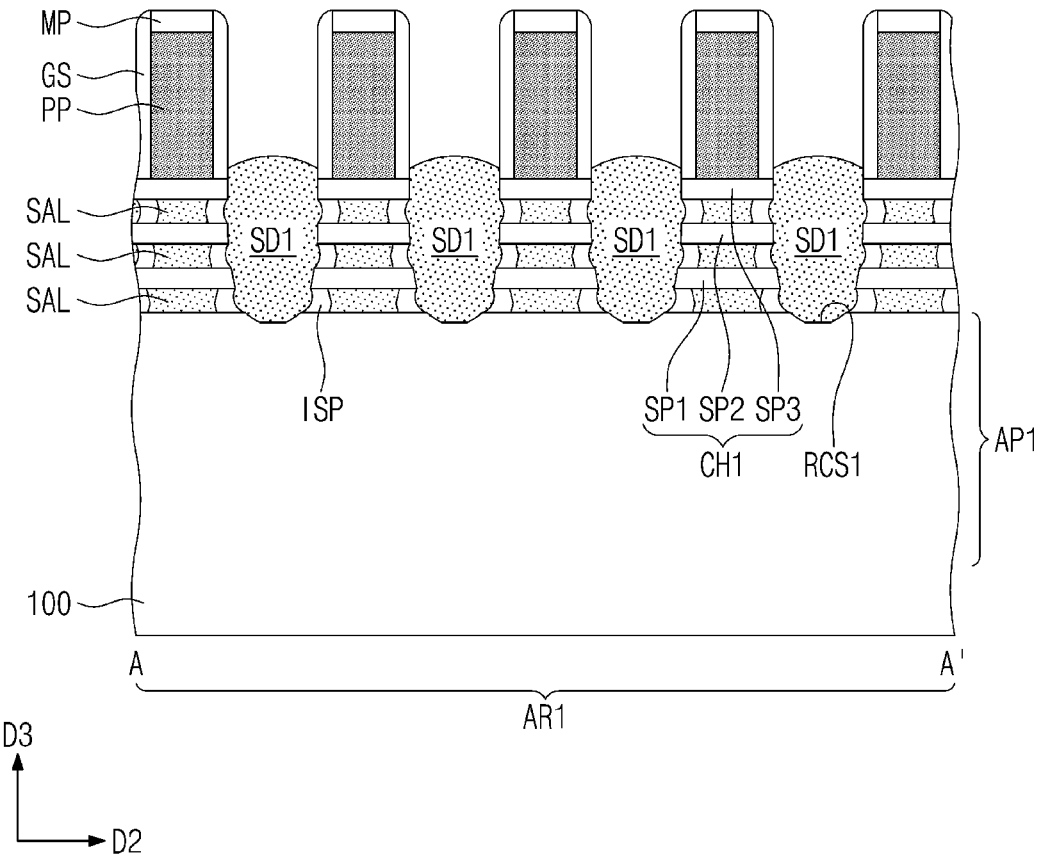
Figure 10B:
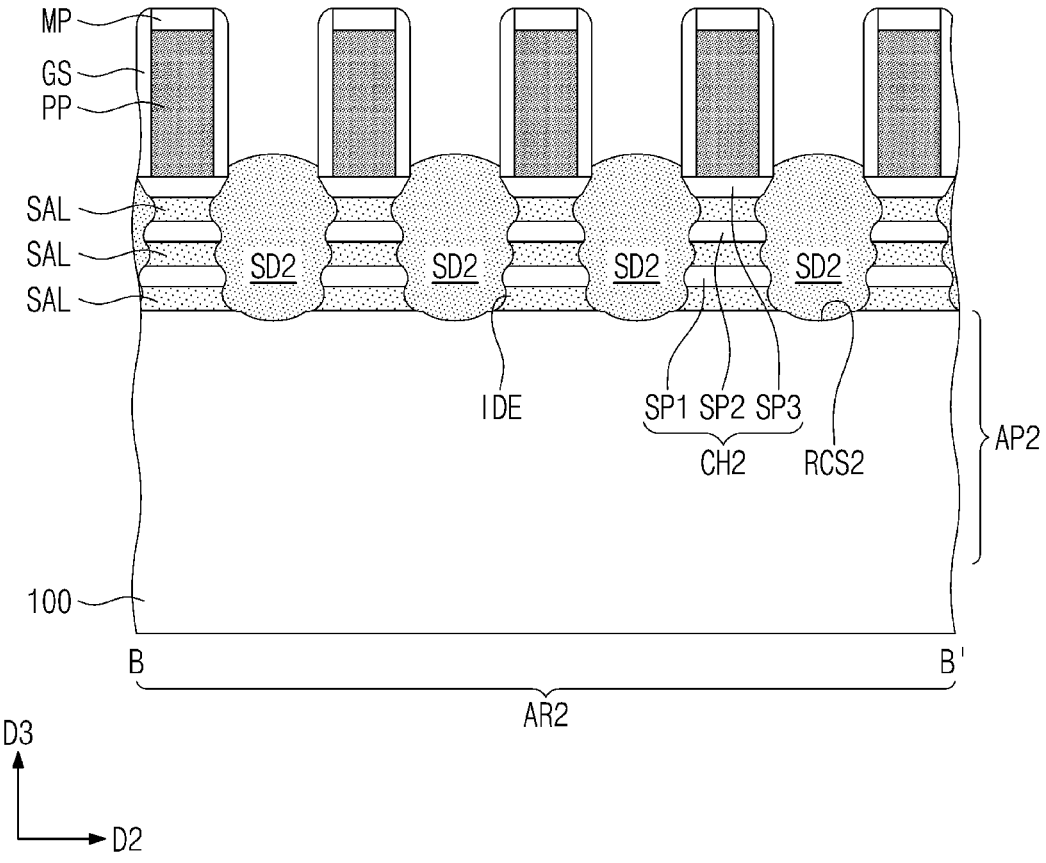
Figure 10C:
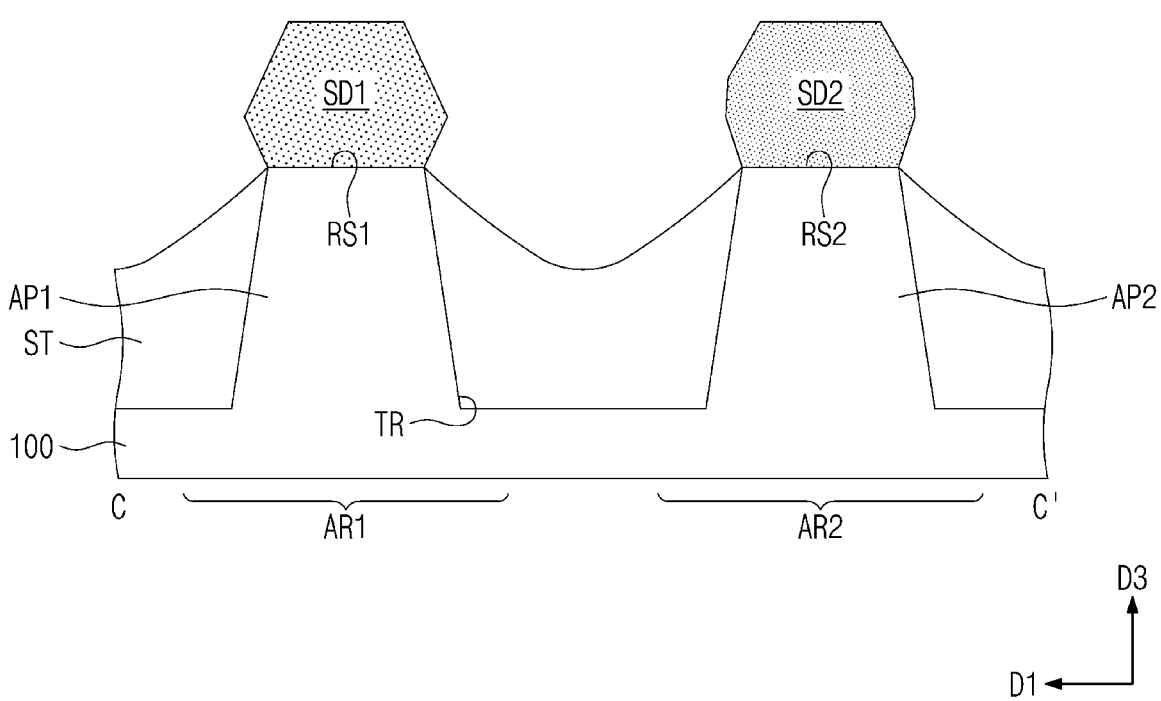

Referring to FIGS. 8A and 8B and 25, sacrificial patterns PP may be formed on the substrate 100 to cross the stacking patterns STP (step 102). Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and aniso-tropically etching the gate spacer layer. In an embodiment, the gate spacer GS may be a multi-layered structure includ-ing at least two layers.

Referring to FIGS. 9A to 9C and 25, the first recesses RCS1 may be formed in the stacking pattern STP on the first active pattern AP1 (step 103). The second recesses RCS2 may be formed in the stacking pattern STP on the second active pattern AP2. During the formation of the first and second recesses RCS1 and RCS2, the device isolation layer ST may also be recessed at opposite sides of each of the first and second active patterns AP1 and AP2 (e.g., see FIG. 9C).

In detail, the first recesses RCS1 may be formed by etching the stacking pattern STP on the first active pattern AP1 using the hard mask patterns MP and the gate spacers GS as an etch mask. The first recess RCS1 may be formed between a pair of the sacrificial patterns PP. A width of the first recess RCS1 in the second direction D2 may decrease as a distance to the substrate 100 decreases.

The first to third semiconductor patterns SP1, SP2, and SP3, which are sequentially stacked between adjacent ones of the first recesses RCS1, may be respectively formed from the active layers ACL. The first to third semiconductor patterns SP1, SP2, and SP3 between adjacent ones of the first recesses RCS1 may constitute the first channel pattern CH1.

The sacrificial layers SAL may be exposed through the first recess RCS1. A selective etching process may be performed on the exposed sacrificial layers SAL. The etch-ing process may include a wet etching process of removing only silicon-germanium selectively. As a result of the etch-ing process, each of the sacrificial layers SAL may be indented to form an indent region IDR. Due to the presence of the indent region IDR, the sacrificial layer SAL may have a concave side surface.

The inner spacers ISP may be formed to fill the indent regions IDR of the first recess RCS1, respectively. In detail, an insulating layer may be formed in the first recess RCS1 to fill the indent regions IDR. The insulating layer may include or may be at least one of a silicon oxide layer, a silicon nitride layer, and a silicon oxynitride layer. A wet etching process may be performed on the insulating layer to expose side surfaces of the first to third semiconductor patterns SP1, SP2, and SP3, and as a result, it may be possible to form the inner spacer ISP, which is left in only the indent region IDR.

Referring back to FIGS. 9A to 9C and 25, the second recesses RCS2 in the stacking pattern STP on the second active pattern AP2 may be formed by a method that is similar to that for the first recesses RCS1 (step 103). A selective etching process may be performed on the sacrificial layers SAL, which are exposed by the second recess RCS2, to form indent regions IDE in the second recess RCS2. Due to the indent regions IDE, the second recess RCS2 may have a wavy inner side surface. The inner spacers ISP may not be formed in the indent regions IDE on the second active pattern AP2. The first to third semiconductor patterns SP1, SP2, and SP3 between adjacent ones of the second recesses RCS2 may constitute the second channel pattern CH2.

Referring to FIGS. 10A to 10C and 25, the first source/ drain patterns SD1 may be formed in the first recesses RCS1, respectively (step 104). In detail, a first SEG process, in which an inner surface of the first recess RCS1 is used as a seed layer, may be performed to form an epitaxial layer filling the first recess RCS1. The epitaxial layer may be grown using the first to third semiconductor patterns SP1, SP2, and SP3 and the first active pattern AP1 (i.e., an upper portion of the substrate 100), which are exposed by the first recess RCS1, as the seed layer. In an embodiment, the first SEG process may include a chemical vapor deposition (CVD) process or a molecular beam epitaxy (MBE) process.

In an embodiment, the first source/drain pattern SD1 may be formed of or include the same semiconductor element (e.g., Si) as the substrate 100. During the formation of the first source/drain pattern SD1, the first source/drain pattern SD1 may be doped in-situ with n-type impurities (e.g., phosphorus, arsenic, or antimony). Alternatively, impurities may be injected into the first source/drain pattern SD1, after the formation of the first source/drain pattern SD1.

The second source/drain patterns SD2 may be formed in the second recesses RCS2, respectively. In detail, the second source/drain pattern SD2 may be formed by a second SEG process using an inner surface of the second recess RCS2 as a seed layer. The second source/drain pattern SD2 may be grown using the first to third semiconductor patterns SP1, SP2, and SP3, the sacrificial layers SAL, and the second active pattern AP2 (i.e., an upper portion of the substrate 100), which are exposed by the second recess RCS2, as the seed layer.

In an embodiment, the second source/drain pattern SD2 may be formed of or include a semiconductor material (e.g., SiGe) whose lattice constant is greater than that of a semiconductor material of the substrate 100. During the formation of the second source/drain pattern SD2, the second source/drain pattern SD2 may be doped in-situ with p-type impurities (e.g., boron, gallium, or indium). Alternatively, impurities may be injected into the second source/drain pattern SD2, after the formation of the second source/drain pattern SD2.

Figure 11A:
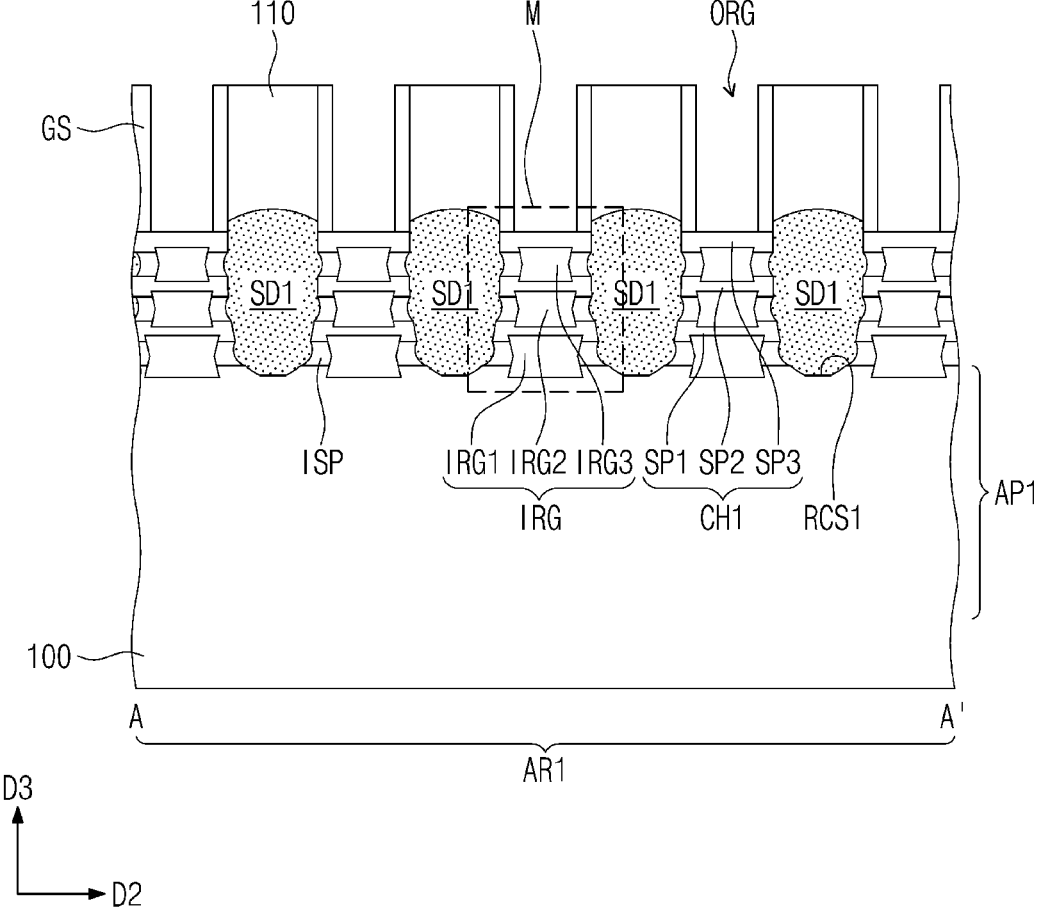
Figure 11B:
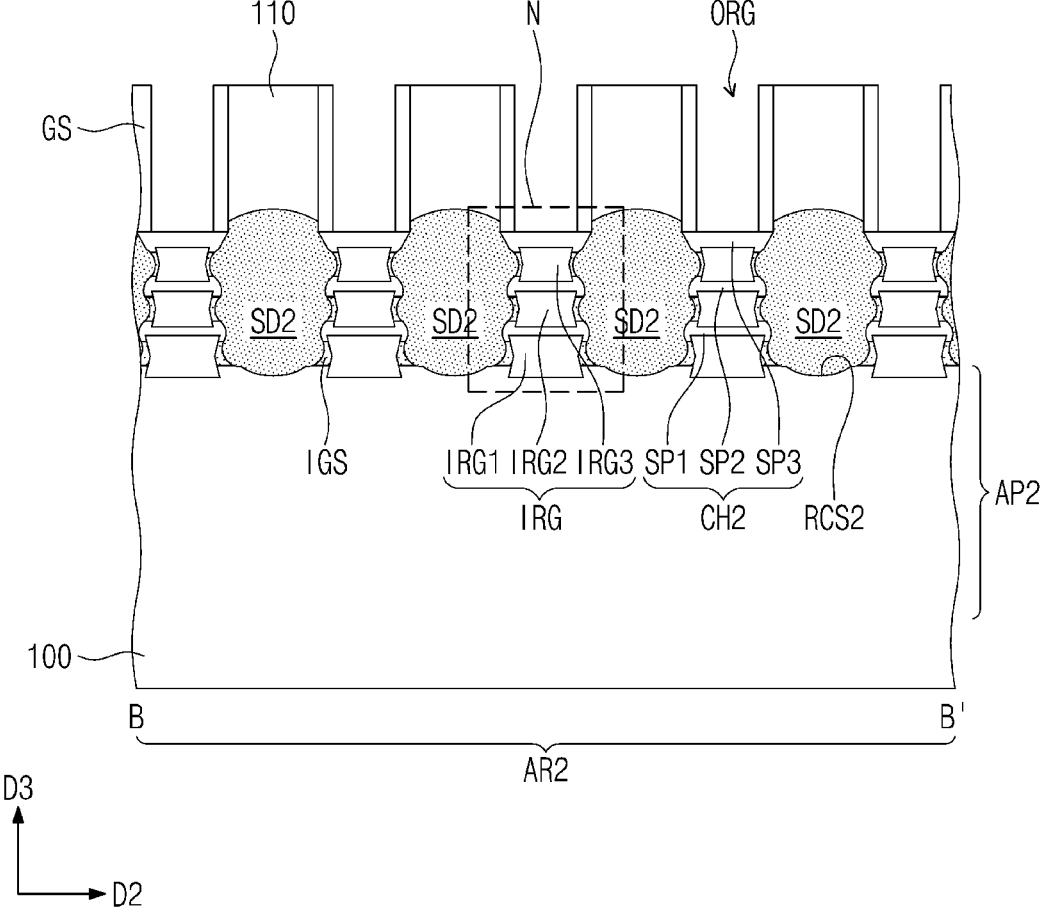
Figure 11C:
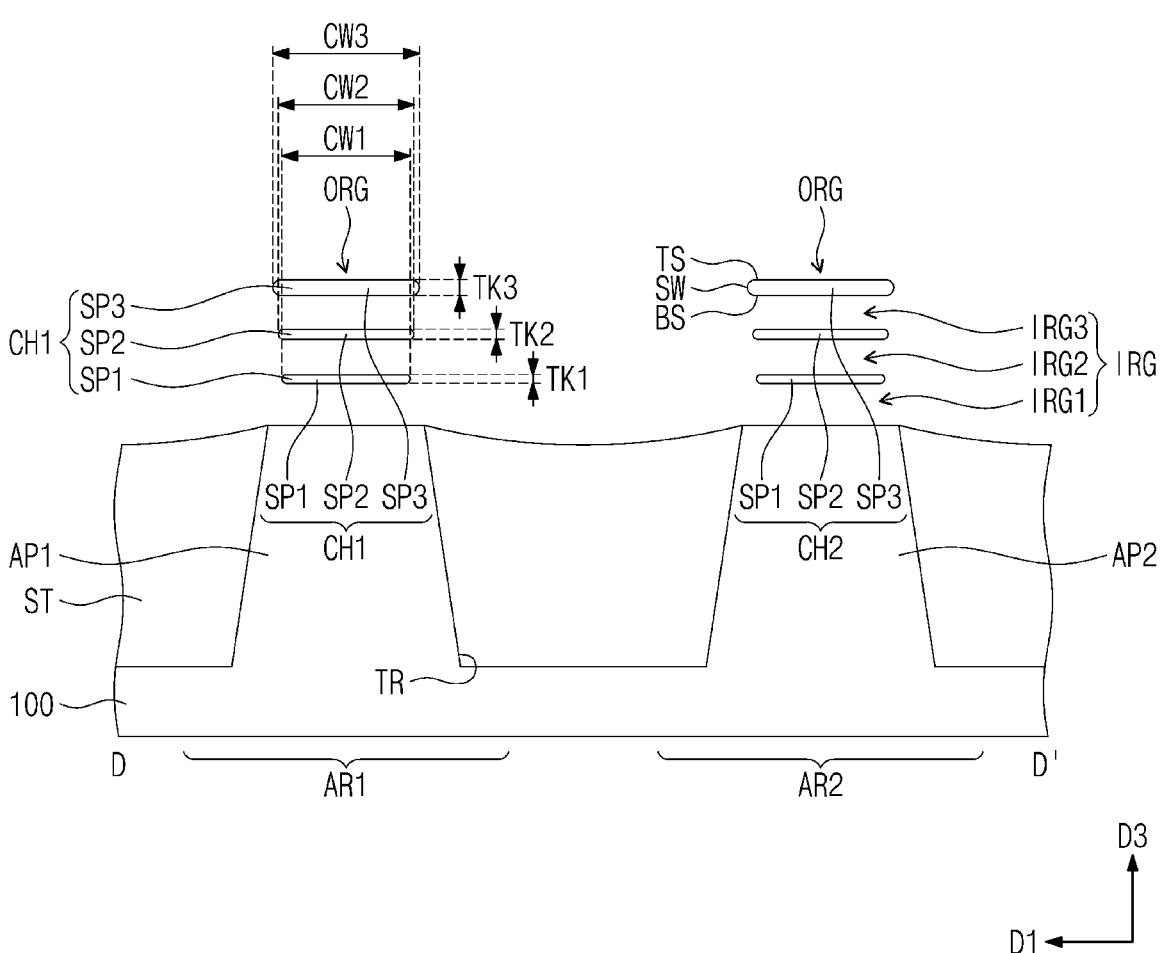

Referring to FIGS. 11A to 11C, the first interlayer insulating layer 110 may be formed to cover the first and second source/drain patterns SD1 and SD2, the hard mask patterns MP, and the gate spacers GS. In an embodiment, the first interlayer insulating layer 110 may include or may be a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar with the top surfaces of the sacrificial patterns PP and the top surfaces of the gate spacers GS.

The exposed sacrificial patterns PP may be selectively removed (step 105 of FIG. 25). As a result of the removal of the sacrificial patterns PP, an outer region ORG exposing the first and second channel patterns CH1 and CH2 may be formed (e.g., see FIG. 11C). The removal of the sacrificial patterns PP may include a wet etching process which is performed using etching solution capable of selectively etching polysilicon.

The sacrificial layers SAL exposed through the outer region ORG may be selectively removed to form inner regions IRG (e.g., see FIG. 11C)(step 105 of FIG. 25). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

During the etching process, the sacrificial layers SAL on the first and second active regions AR1 and AR2 may be removed. The etching process may be a wet etching process. An etchant material, which is used in the etching process, may be chosen to quickly remove the sacrificial layer SAL having a relatively high germanium concentration.

Referring back to FIG. 11C, since the sacrificial layers SAL are selectively removed, only the stacked first to third semiconductor patterns SP1, SP2, and SP3 may be left on each of the first and second active patterns AP1 and AP2. Empty regions, which are formed by removing the sacrificial layers SAL, may form first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A and 11B, each of the first to third inner regions IRG1, IRG2, and IRG3 according to an embodiment of the inventive concept may be further expanded in a vertical direction. In this case, each of the first to third inner regions IRG1, IRG2, and IRG3 may have a sandglass shape. The expanding of the inner regions IRG1 to IRG3 may include recessing the semiconductor patterns SP1, SP2, and SP3, which are exposed by the inner regions IRG1 to IRG3. Hereinafter, a method of expanding the inner regions IRG1 to IRG3 will be described in more detail with reference to FIGS. 13A to 16B.

FIGS. 13A, 14A, 15A, and 16A are enlarged sectional views illustrating a method of forming a portion 'M' of FIG. 11A. FIGS. 13B, 14B, 15B, and 16B are enlarged sectional views illustrating a method of forming a portion 'N' of FIG. 11B.

Figure 13A:
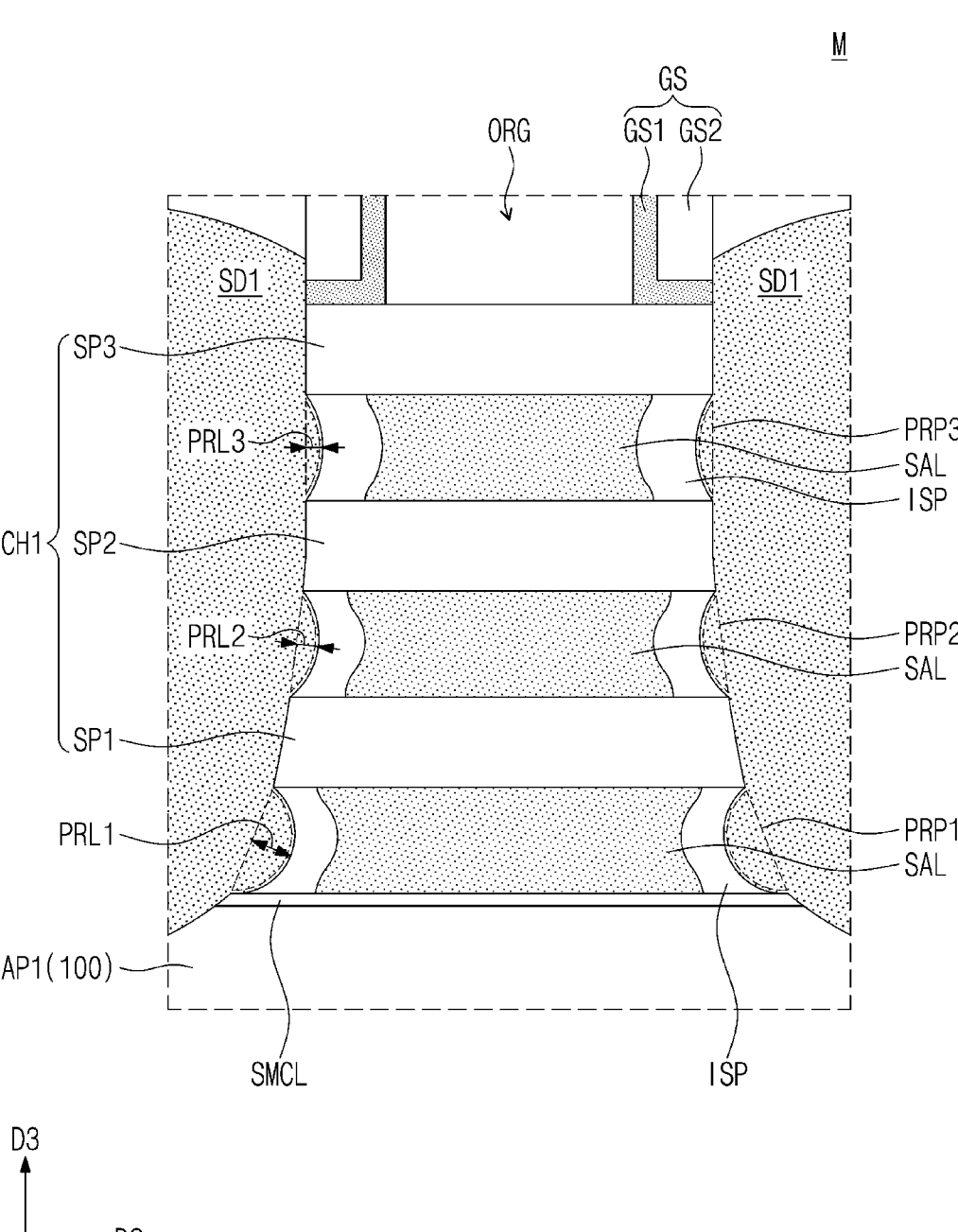
FIGS. 13A, 14A, 15A, and 16A are enlarged sectional views illustrating a method of forming a portion 'M' of FIG. 11A.
Figure 13B:
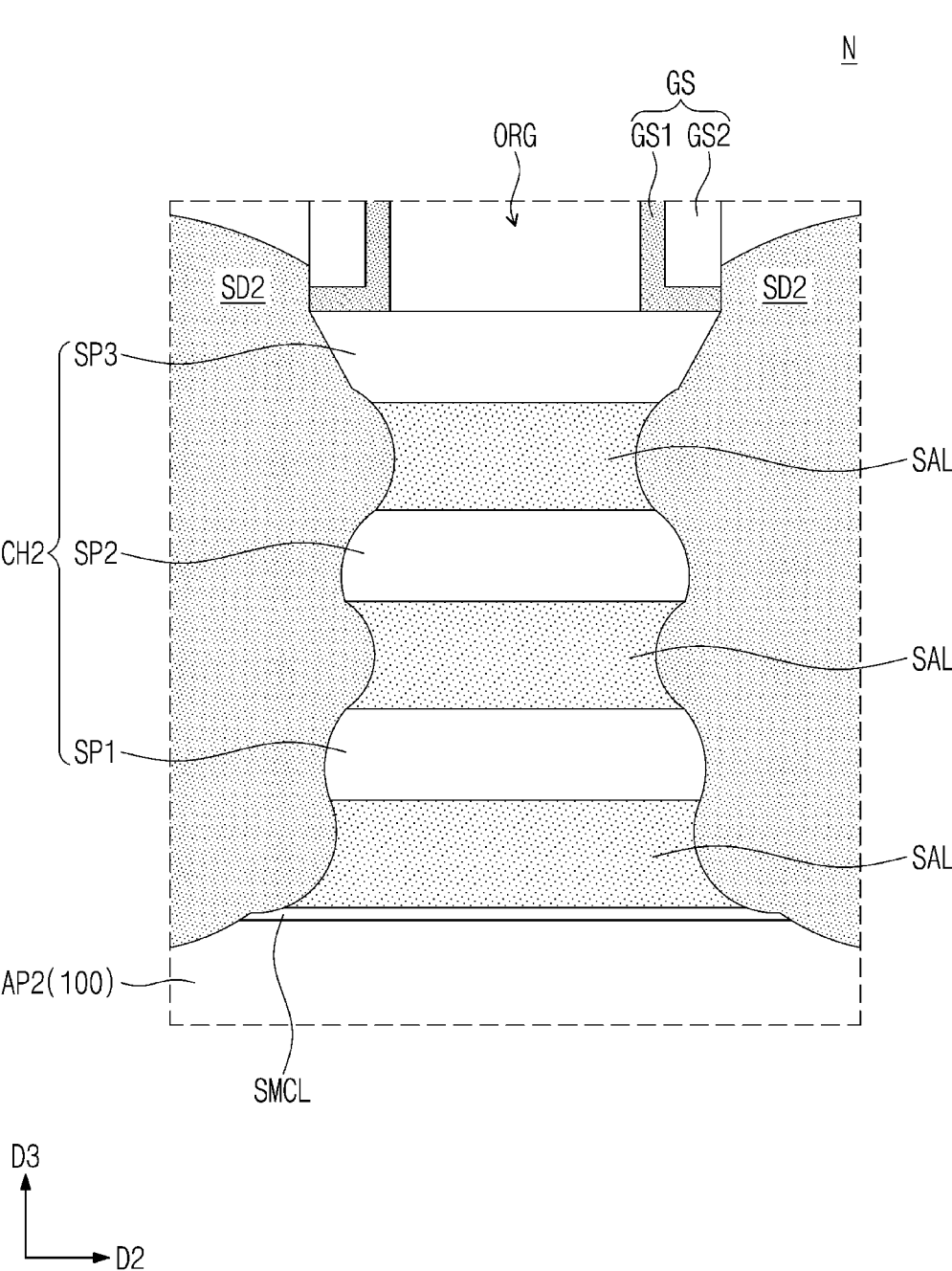
FIGS. 13B, 14B, 15B, and 16B are enlarged sectional views illustrating a method of forming a portion 'N' of FIG. 11B.

Referring to FIGS. 13A and 13B and 25, the outer region ORG may be formed by selectively removing the sacrificial pattern PP (step 105). The outer region ORG may expose the sacrificial layers SAL between the first source/drain patterns SD1. The outer region ORG may expose the sacrificial layers SAL between the second source/drain patterns SD2.

In an embodiment, the semiconductor layer SMCL may be provided between the lowermost one of the sacrificial layers SAL and the active pattern AP1 or AP2. The semiconductor layer SMCL may be formed by an epitaxial growth process using the top surface of the active pattern AP1 or AP2 as a seed layer. The semiconductor layer SMCL may be formed of or include one of silicon (Si), germanium (Ge), and silicon-germanium (SiGe).

Figure 14A:
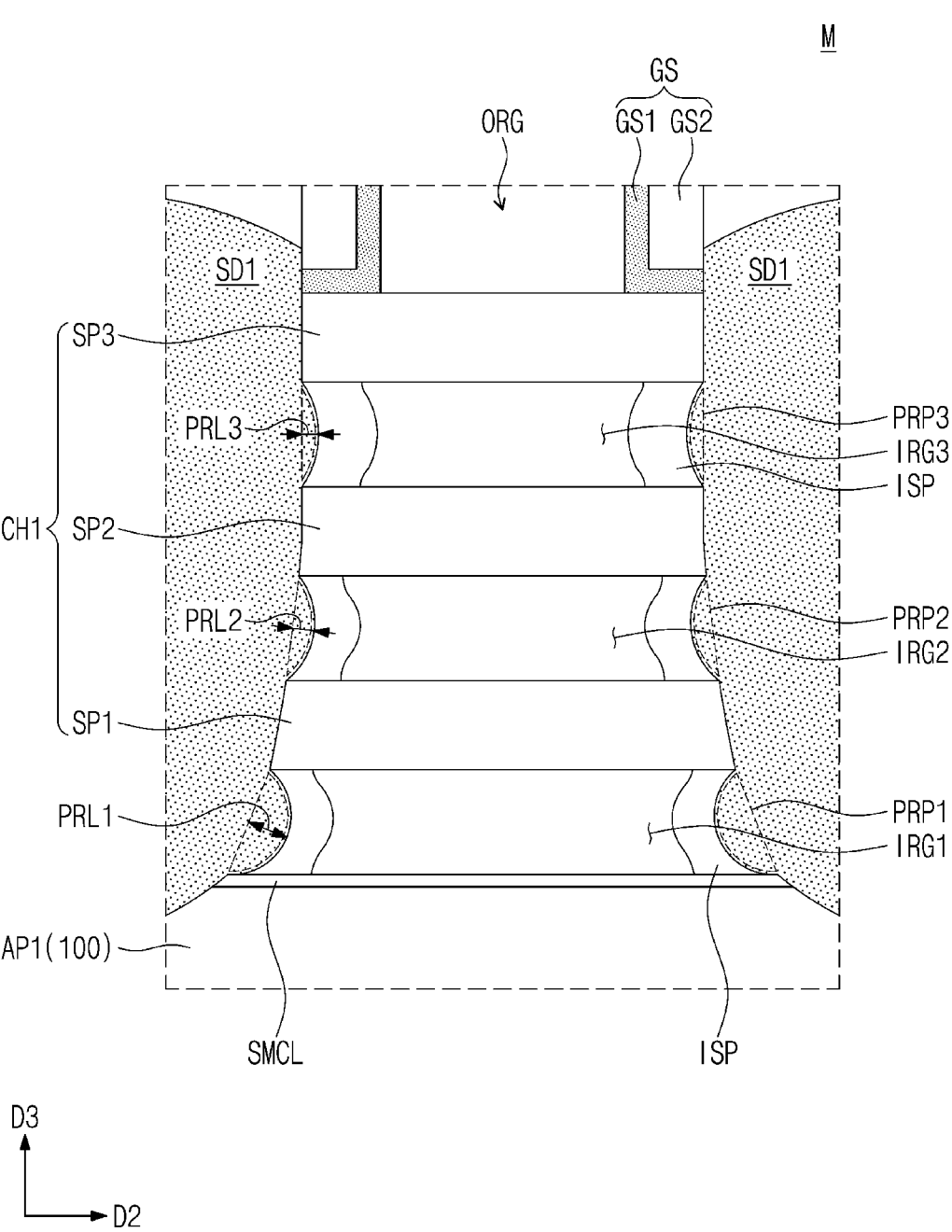
Figure 14B:
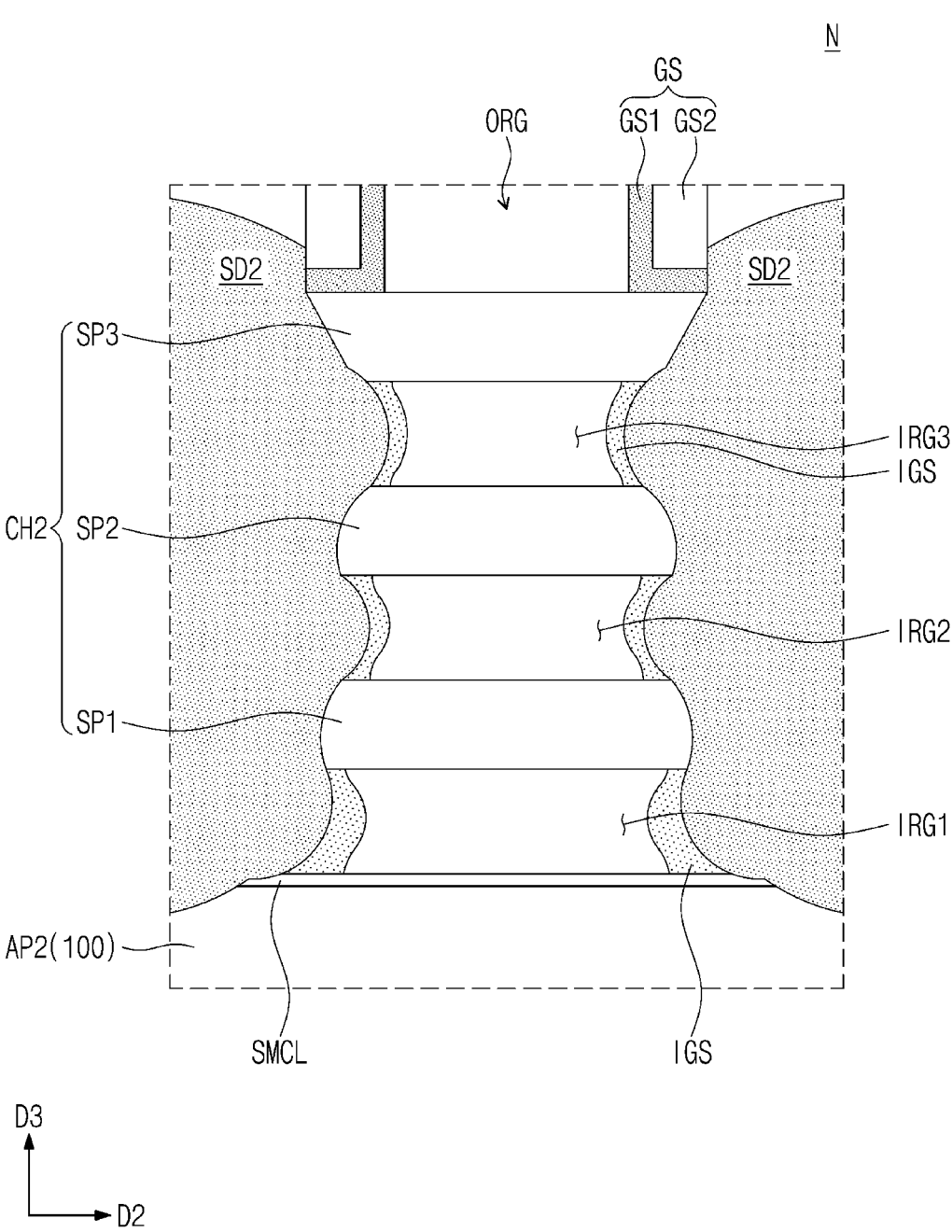

Referring to FIGS. 14A and 14B and 25, the sacrificial layers SAL exposed by the outer region ORG may be selectively removed (step 105). Accordingly, the first to third inner regions IRG1, IRG2, and IRG3, which are sequentially stacked, may be formed. Each of the first to third inner regions IRG1, IRG2, and IRG3 may be an empty space. The first to third inner regions IRG1, IRG2, and IRG3 may be formed to expose the first to third semiconductor patterns SP1, SP2, and SP3.

The inner gate spacers IGS may be formed in the first to third inner regions IRG1, IRG2, and IRG3, respectively, which are located on the second active pattern AP2. The inner gate spacers IGS may be formed to cover the second source/drain pattern SD2 but to expose the first to third semiconductor patterns SP1, SP2, and SP3. In other words, the inner gate spacers IGS may be selectively formed on only the surface of the second source/drain pattern SD2.

In an embodiment, the formation of the inner gate spacers IGS may include depositing a spacer layer in the first to third inner regions IRG1, IRG2, and IRG3 in a horizontal direction (e.g., the second direction D2) and performing a wet etching process on the spacer layer to expose the first to third semiconductor patterns SP1, SP2, and SP3.

In an embodiment, the formation of the inner gate spacers IGS may include selectively oxidizing the surface of the second source/drain pattern SD2, which is exposed by the first to third inner regions IRG1, IRG2, and IRG3, to form an oxide layer.

In an embodiment, the inner gate spacers IGS may be omitted.

Figure 15A:
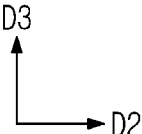
Figure 15B:
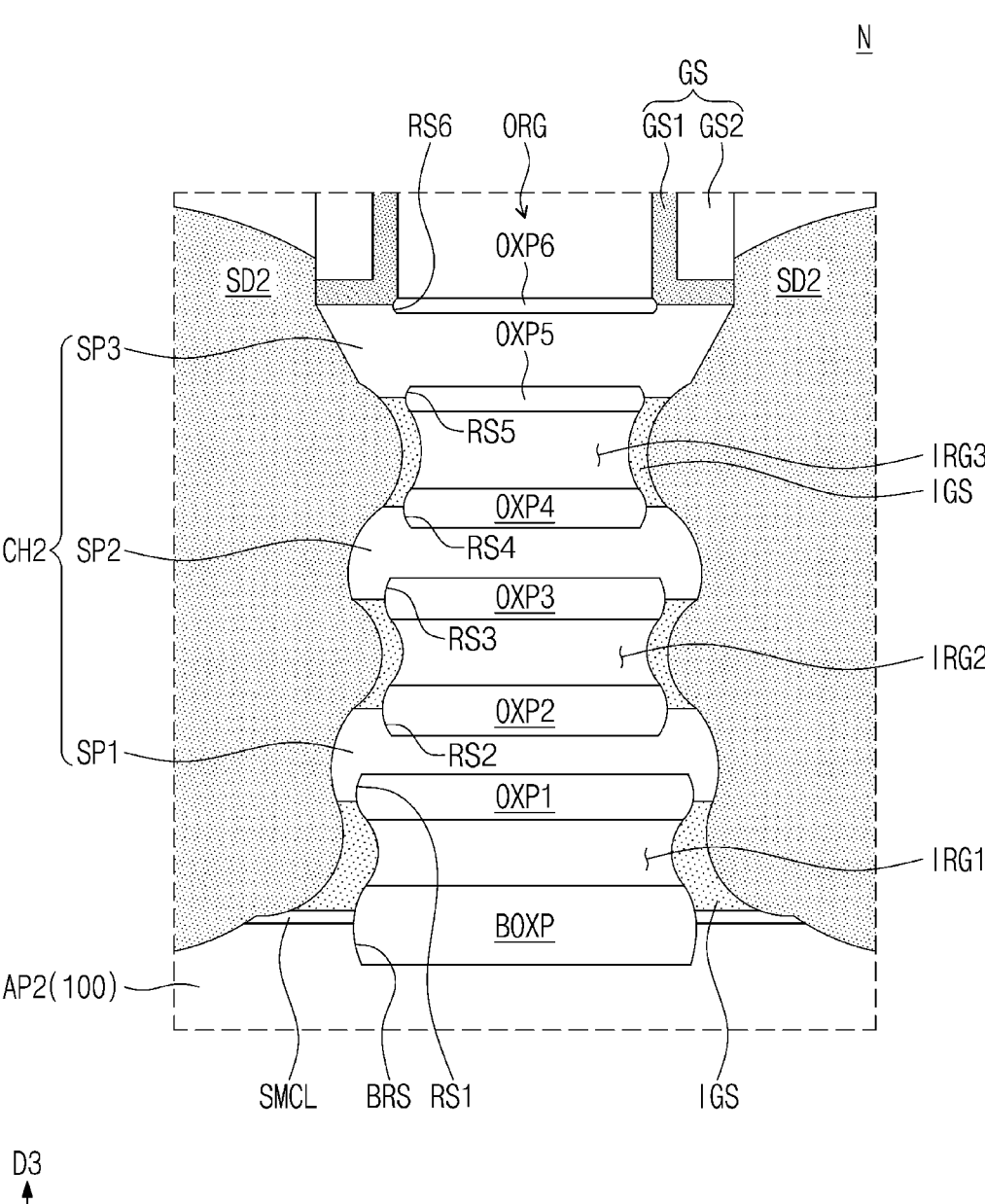

Referring to FIGS. 15A and 15B and 25, an oxidation process may be performed on the surfaces of the first to third semiconductor patterns SP1, SP2, and SP3 exposed by the first to third inner regions IRG1, IRG2, and IRG3 (step 106). Accordingly, oxide patterns OXP1 to OXP6 may be formed on the exposed surfaces of the first to third semiconductor patterns SP1, SP2, and SP3.

Due to the inner spacers ISP covering the surface of the first source/drain pattern SD1, it may be possible to prevent the first source/drain pattern SD1 from being oxidized during the oxidation process. Due to the inner gate spacers IGS covering the surface of the second source/drain pattern SD2, it may be possible to prevent the second source/drain pattern SD2 from being oxidized during the oxidation process.

Since the first to sixth oxide patterns OXP1 to OXP6 are formed on the exposed first to third semiconductor patterns SP1, SP2, and SP3, the first to sixth channel recesses RS1 to RS6 may be formed in the exposed first to third semiconductor patterns SP1, SP2, and SP3. The first to sixth channel recesses RS1 to RS6 may be formed by the first to sixth oxide patterns OXP1 to OXP6, respectively.

The larger the oxidation amount of the exposed first to third semiconductor patterns SP1, SP2, and SP3 increases, the larger the size of the corresponding channel recess RS1 to RS6. The larger the size of the oxide pattern OXP1 to OXP6, the larger the size of a corresponding channel recess RS1 to RS6. For example, as a distance from the lower tier in a direction toward the upper tier increases, the sizes of the first to sixth oxide patterns OXP1 to OXP6 may decrease or may gradually decrease. Thus, recess depths of the first to sixth channel recesses RS1 to RS6 may decrease or may gradually decrease, as a distance from the lower tier in a direction toward the upper tier increases. Recess widths of the first to sixth channel recesses RS1 to RS6 in the second direction D2 may decrease or may gradually decrease, as a distance from the lower tier in a direction toward the upper tier increases.

An upper portion of the active pattern AP1 or AP2 exposed by the first inner region IRG1 may be oxidized to form a body oxide pattern BOXP. Meanwhile, the semiconductor layer SMCL, which is exposed by the first inner region IRG1, may contribute to the oxidation of the active pattern AP1 or AP2. For example, a part of the semiconductor layer SMCL may be oxidized during a time when the upper portion of the active pattern AP1 or AP2 is oxidized. As a result, the body oxide pattern BOXP may be formed to have a size that is larger than the sizes of the oxide patterns OXP1 to OXP6. The size of the body recess BRS, which is formed by the body oxide pattern BOXP, may be larger than the sizes of the channel recesses RS1 to RS6.

In an embodiment, before the oxidation process, a reactive-ion etching (RIE) process may be performed on the exposed first to third semiconductor patterns SP1, SP2, and SP3. Owing to the RIE process, shallow first to sixth channel recesses RS1 to RS6 of small depths may be formed in advance. Thereafter, the oxidation process may be performed to form the first to sixth oxide patterns OXP1 to OXP6 on the shallow first to sixth channel recesses RS1 to RS6. As a result, the depths of the first to sixth channel recesses RS1 to RS6 may be increased.

Figure 16A:
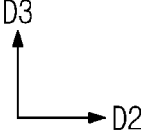
Figure 16B:
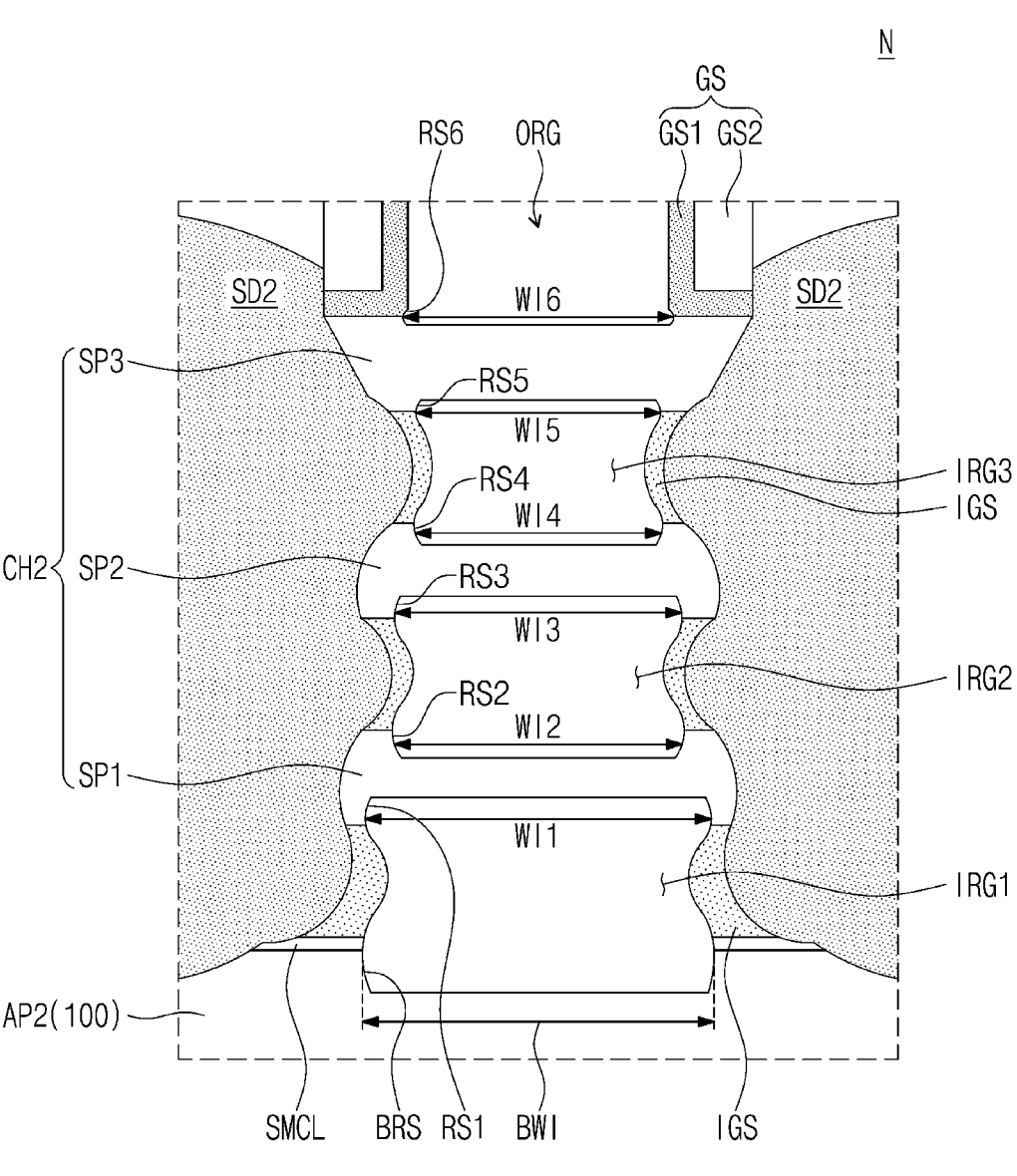
Figure 16B:
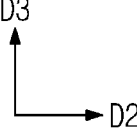

Referring to FIGS. 16A and 16B and 25, the body oxide pattern BOXP and the first to sixth oxide patterns OXP1 to OXP6 may be selectively removed (step 107). Accordingly, the inner regions IRG1 to IRG3 may be connected to the channel recesses RS1 to RS6 to be vertically expanded.

The first to sixth recess depths DE1 to DE6 of the first to sixth channel recesses RS1 to RS6 may decrease, as a distance from the lower tier in a direction toward the upper tier increases. The first to sixth recess widths WI1 to WI6 of the first to sixth channel recesses RS1 to RS6 may decrease, as a distance from the lower tier in a direction toward the upper tier increases. Accordingly, sizes of the first to third inner regions IRG1, IRG2, and IRG3 may decrease as a distance from the lower tier in a direction toward the upper tier increases.

Referring back to FIG. 11C, in the case where, as previously described with reference to FIGS. 15A and 15B, the first to third semiconductor patterns SP1 to SP3 are oxidized, the sizes of the first to third semiconductor patterns SP1 to SP3 may be reduced. The size of the second semiconductor pattern SP2 may be reduced to be smaller than the size of the third semiconductor pattern SP3, and the size of the first semiconductor pattern SP1 may be reduced to be smaller than the size of the second semiconductor pattern SP2. As a result of the oxidation, each of the first to third semiconductor patterns SP1 to SP3 may have rounded side surfaces SW. The first to third thicknesses TK1 to TK3 of the first to third semiconductor patterns SP1 to SP3 may increase, as a distance from the lower tier in a direction toward the upper tier increases. The first to third channel widths CW1 to CW3 of the first to third semiconductor patterns SP1 to SP3 may increase, as a distance from the lower tier in a direction toward the upper tier increases.

Referring to FIGS. 12A to 12C and 25, the gate insulating layer GI may be formed on the exposed first to third semiconductor patterns SP1, SP2, and SP3 (step 108). The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG. The formation of the gate insulating layer GI may include sequentially forming a silicon oxide layer and a high-k dielectric layer.

The gate electrode GE may be formed on the gate insulating layer GI (step 108). The gate electrode GE may include the first to third portions PO1, PO2, and PO3, which are respectively formed in the first to third inner regions IRG1, IRG2, and IRG3, and the fourth portion PO4, which is formed in the outer region ORG.

Figure 12A:
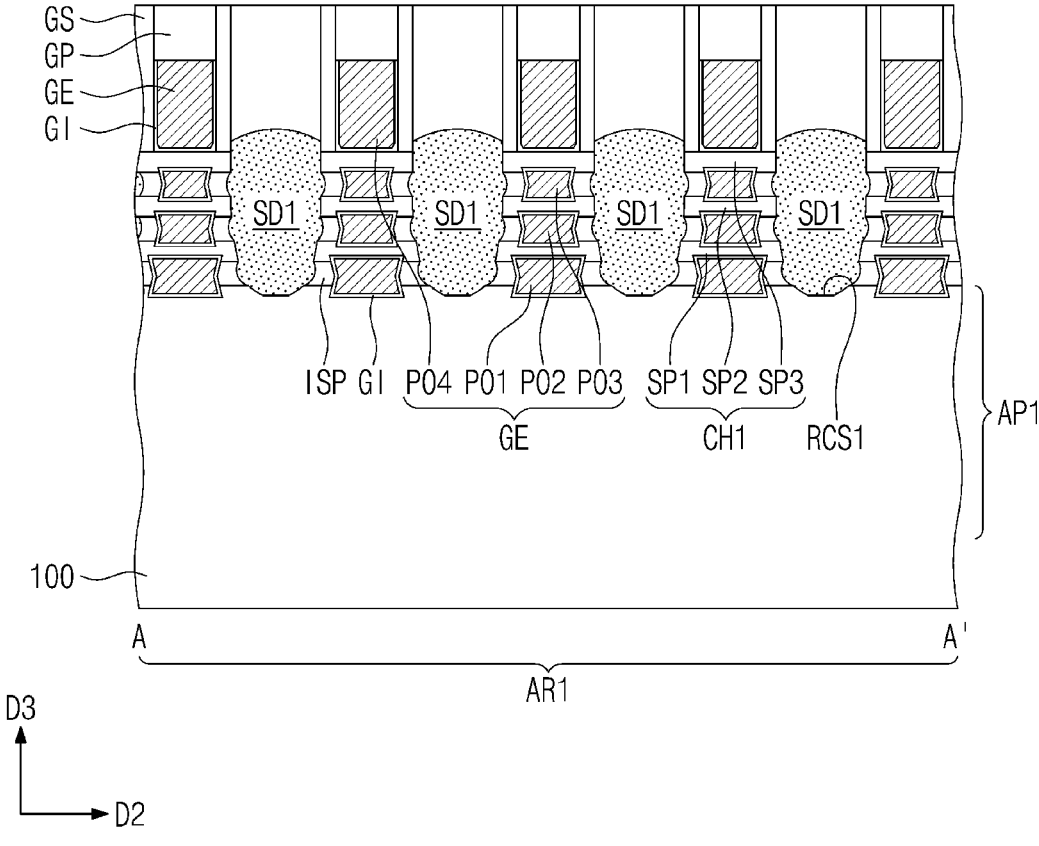
Figure 12B:
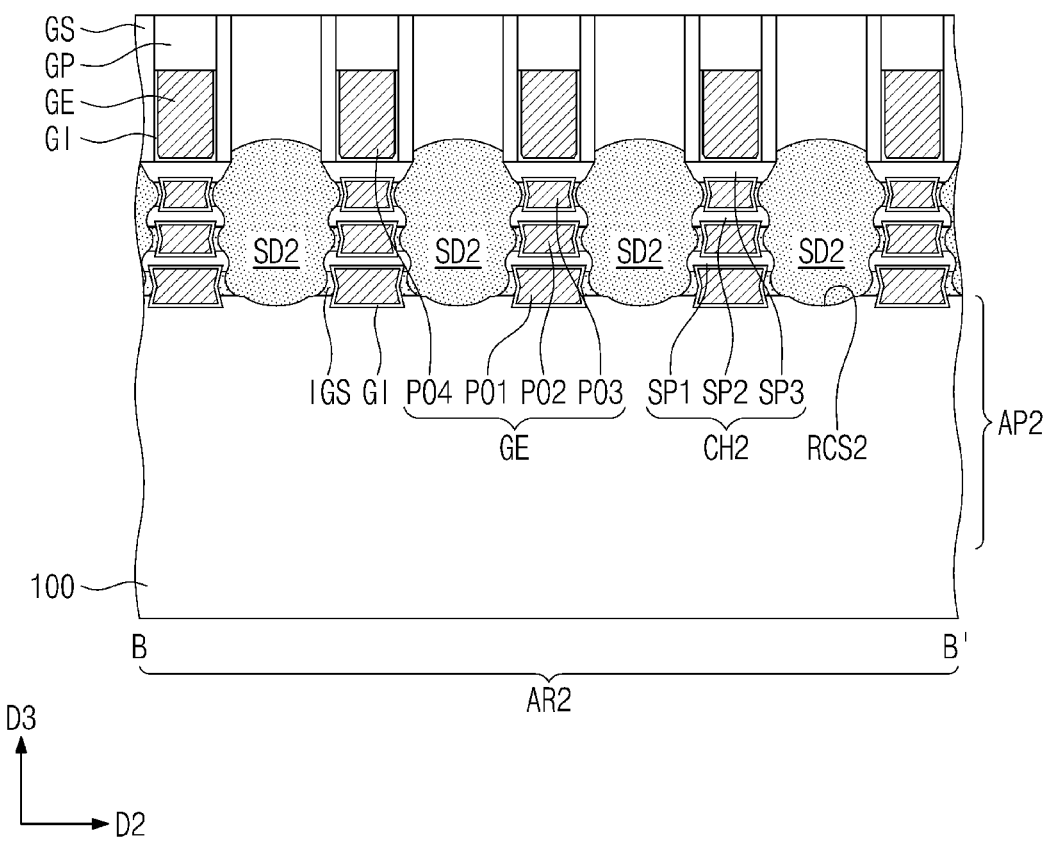
Figure 12C:
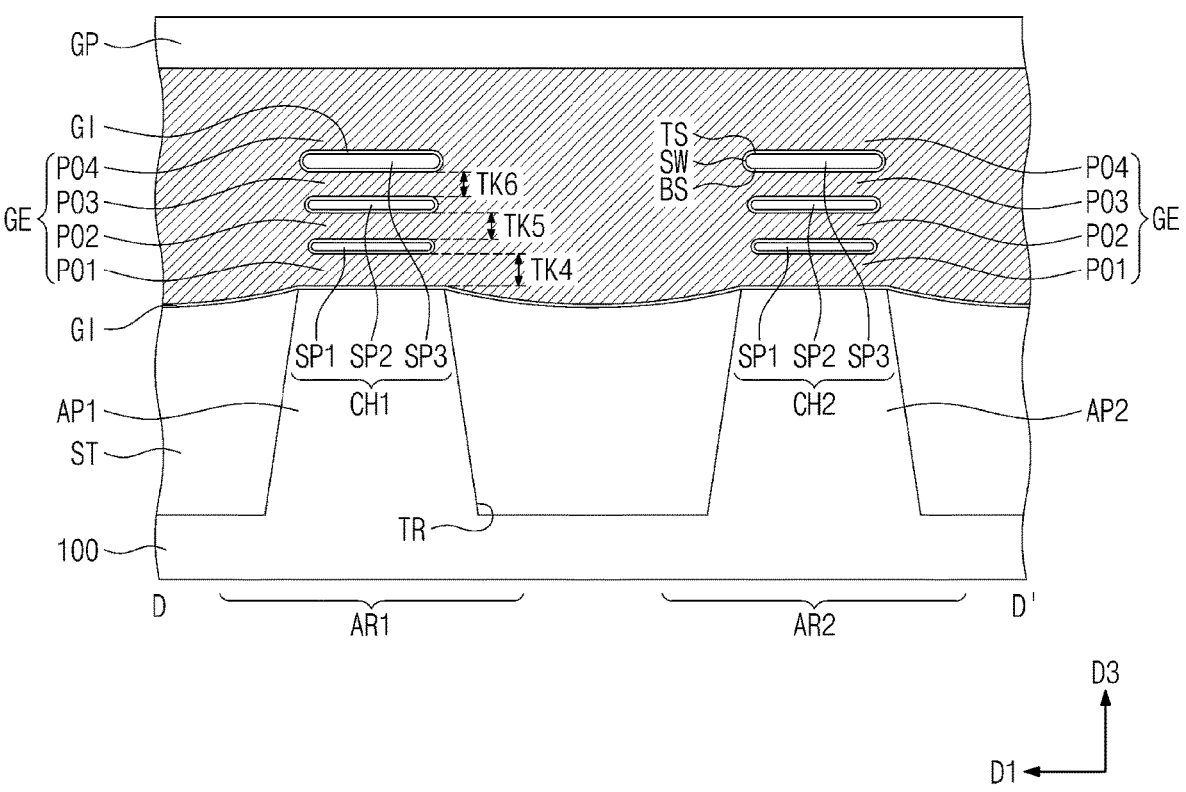

As a distance from the lower tier in a direction toward the upper tier increases, sizes or volumes of the first to third portions PO1, PO2, and PO3 may decrease or may gradually decrease. For example, as shown in FIG. 12C, the second portion PO2 may be formed to have the thickness TK5 that is smaller than the thickness TK4 of the first portion PO1. The third portion PO3 may be formed to have the thickness TK6 that is smaller than the thickness TK5 of the second portion PO2.

Due to the body recess BRS and the channel recesses RS1 to RS6 described above, each of the first to third portions PO1, PO2, and PO3 adjacent to the channel region may be formed to have a three-dimensional gate structure. Accordingly, in the case where the gate electrode GE according to an embodiment of the inventive concept is used, it may be possible to increase an effective channel length (ECL) and to prevent a short channel effect.

The gate electrode GE may be recessed such that the top surface of the gate electrode GE is located at a level lower than the top surface of the gate spacer GS. The gate capping pattern GP may be formed on the recessed gate electrode GE. The gate capping pattern GP may have a top surface that is substantially coplanar with the top surface of the gate spacer GS.

Referring back to FIGS. 5A to 5D, the second interlayer insulating layer 120 may be formed on the first interlayer insulating layer 110. The second interlayer insulating layer 120 may include or may be a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include or may be formed of a metal layer and a metal nitride layer. The conductive pattern FM may be formed of or include a low resistance metal.

The division structures DB may be respectively formed on the first and second borders BD1 and BD2 of the single height cell SHC. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 17:
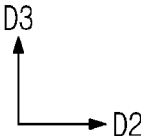
FIGS. 17 and 18 are enlarged sectional views, each of which illustrates the portion 'M' of FIG. 5A according to an embodiment of the inventive concept region.
Figure 18:
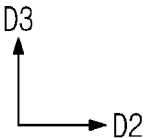
Figure 19:
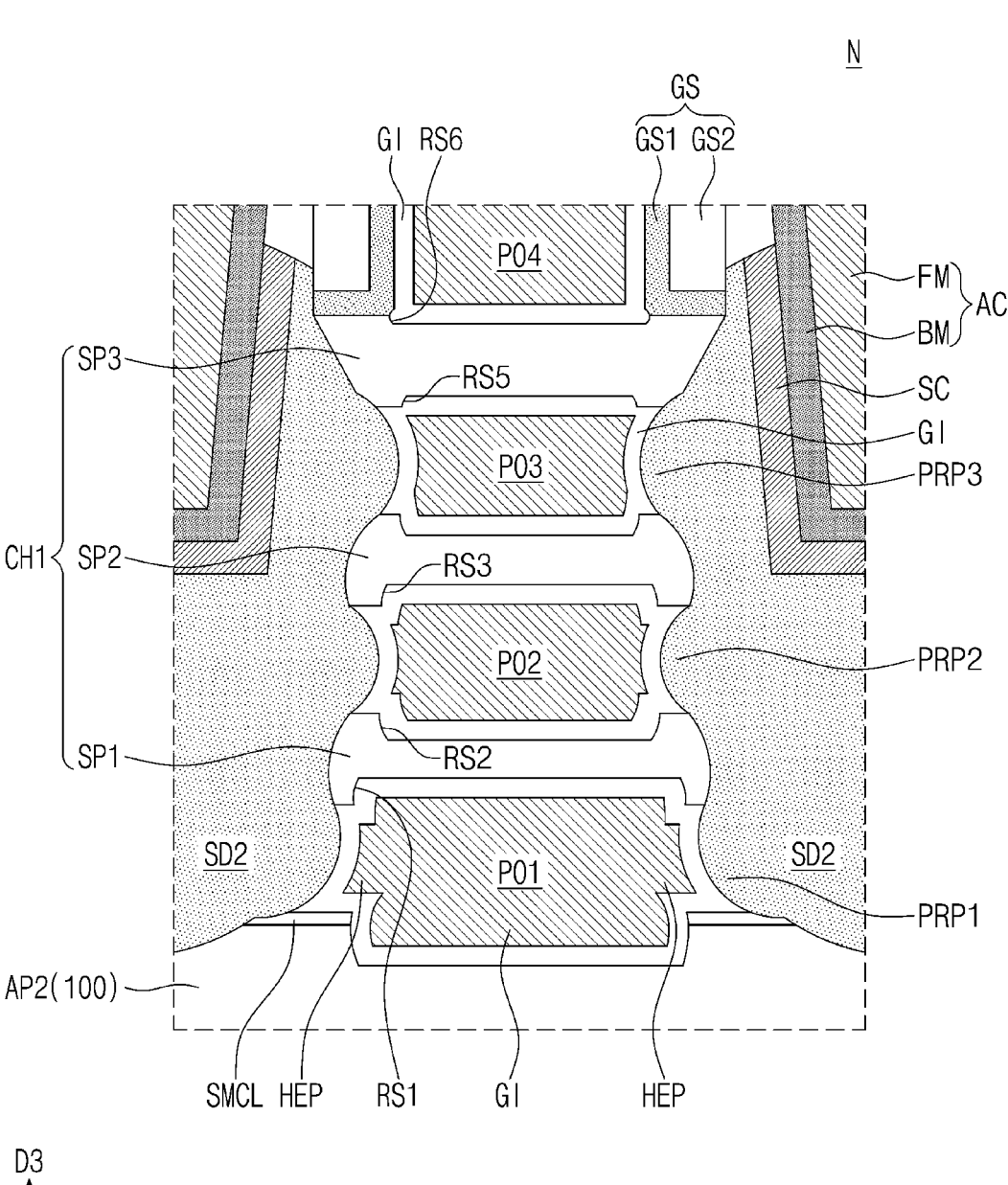
FIGS. 19, 20, and 21 are enlarged sectional views, each of which illustrates the portion 'N' of FIG. 5B according to an embodiment of the inventive concept.
Figure 20:
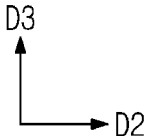
Figure 21:
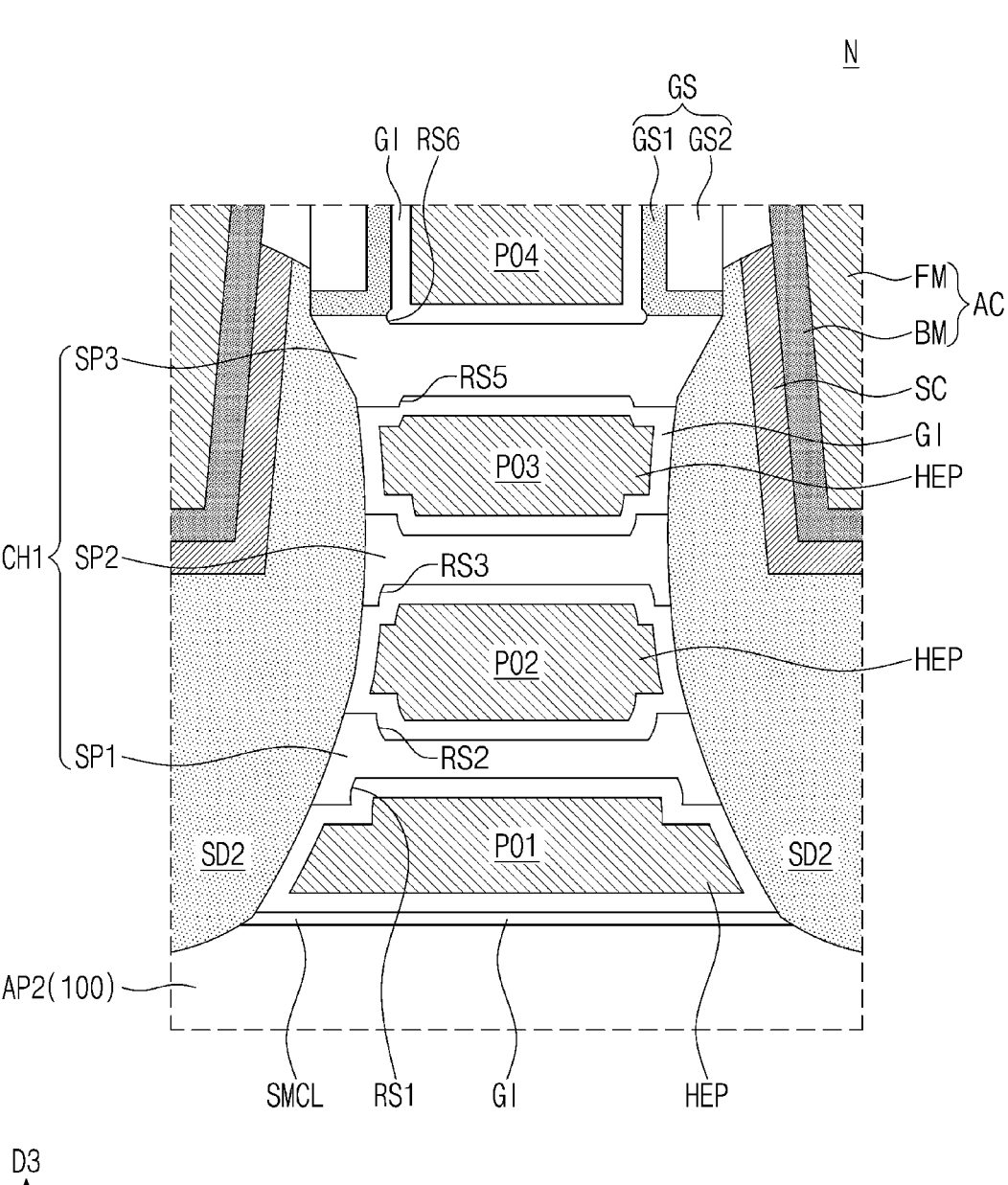

FIGS. 17 and 18 are enlarged sectional views, each of which illustrates the portion 'M' of FIG. 5A according to an embodiment of the inventive concept region. FIGS. 19, 20, and 21 are enlarged sectional views, each of which illustrates the portion 'N' of FIG. 5B according to an embodiment of the inventive concept. In the following description, an element as previously described with reference to FIGS. 1 to 6B may be identified by the same reference number without repeating an overlapping description thereof, for concise description.

Referring to FIG. 17, the body recess BRS may be omitted from the upper portion of the first active pattern AP1. For example, the first active pattern AP1 between adjacent ones of the first source/drain patterns SD1 may have a flat top surface. Since the body recess BRS is omitted, the first portion PO1 of the gate electrode GE may have a size or volume that is smaller than that of the second portion PO2. In an embodiment, the body recess BRS may also be omitted from the upper portion of the second active pattern AP2.

A recess prevention layer RPL may be provided on the top surface of the first active pattern AP1. During the oxidation process as previously described with reference to FIG. 15A, the recess prevention layer RPL may protect the first active pattern AP1 or may prevent the upper portion of the first active pattern AP1 from being oxidized. In other words, due to the recess prevention layer RPL, the body oxide pattern BOXP as previously described with reference to FIG. 15A may not be formed in the upper portion of the first active pattern AP1.

Referring to FIG. 18, a thickness TK7 of the gate insulating layer GI in a horizontal direction may be larger than a thickness TK8 in a vertical direction. For example, the gate insulating layer GI interposed between the second portion PO2 of the gate electrode GE and the inner spacer ISP may have a seventh thickness TK7. The gate insulating layer GI interposed between the second portion PO2 of the gate electrode GE and the second semiconductor pattern SP2 may have an eighth thickness TK8. The seventh thickness TK7 may be larger than the eighth thickness TK8. Since the thickness TK7 of the gate insulating layer GI in the horizontal direction is relatively increased, it may be possible to prevent a leakage current more effectively from the gate electrode GE to the source/drain pattern SD1 or SD2.

The gate insulating layer GI may include an interface layer IL, a paraelectric (or high-k dielectric) layer HK, and a ferroelectric layer FE, which are sequentially stacked. The paraelectric layer HK and the ferroelectric layer FE may be provided to have substantially the same or similar features as the gate insulating layer GI described above. For example, the interface layer IL may include or may be a silicon oxide layer, the paraelectric layer HK may include or may be a hafnium oxide layer, and the ferroelectric layer FE may include or may be a hafnium oxide layer. In an embodiment, the hafnium oxide layer of the ferroelectric layer FE may be doped with at least one of gadolinium Gd, silicon (Si), zirconium (Zr), aluminum (Al), and yttrium (Y).

In an embodiment, controlling the thickness of the gate insulating layer GI such that the thickness TK7 of the gate insulating layer GI in a horizontal direction may be larger than a thickness TK8 in a vertical direction may be achieved by depositing the interface layer IL in a non-uniform manner. For example, the interface layer IL may be formed to be thicker in the horizontal direction than in the vertical direction. Referring to FIG. 19, the inner gate spacers IGS between the first to third portions PO1, PO2, and PO3 of the gate electrode GE and the second source/drain pattern SD2 may be omitted. Accordingly, the gate insulating layer GI enclosing the first to third portions PO1, PO2, and PO3 may directly cover the first to third protruding portions PRP1, PRP2, and PRP3 of the second source/drain pattern SD2.

As an example, the first portion PO1 may include a pair of horizontal extended portions HEP, which are formed to protrude toward the second source/drain patterns SD2 located at opposite sides thereof. Since the first portion PO1 further includes the horizontal extended portions HEP, the first portion PO1 may be formed to have a size or volume that is larger than that of the first portion PO1 in the embodiment of FIG. 6B.

Referring to FIG. 20, the inner gate spacers IGS between the first to third portions PO1, PO2, and PO3 of the gate electrode GE and the second source/drain pattern SD2 may be omitted. In addition, the first to third protruding portions PRP1, PRP2, and PRP3 of the second source/drain pattern SD2 may be omitted. The gate insulating layer GI enclosing the first to third portions PO1, PO2, and PO3 may contact the side surface of the second source/drain pattern SD2. Each of the first to third portions PO1, PO2, and PO3 of the gate electrode GE may include a pair of horizontal extended portions HEP, which are formed to protrude toward the second source/drain patterns SD2 located at opposite sides thereof.

Referring to FIG. 21, the body recess BRS in the semiconductor device of FIG. 20 may be omitted from the upper portion of the second active pattern AP2. That is, the first active pattern AP1 between adjacent ones of the first source/drain patterns SD1 may have a flat top surface. Since the body recess BRS is omitted, a channel region, which is formed in the upper portion of the second active pattern AP2, may have a flat or two-dimensional structure.

The semiconductor layer SMCL covering the top surface of the second active pattern AP2 may be extended from one of the first source/drain patterns SD1 to another of the first source/drain patterns SD1 without any discontinuous portion. In an embodiment, the semiconductor layer SMCL may be replaced with the recess prevention layer RPL as previously described with reference to FIG. 17.

Figure 22:
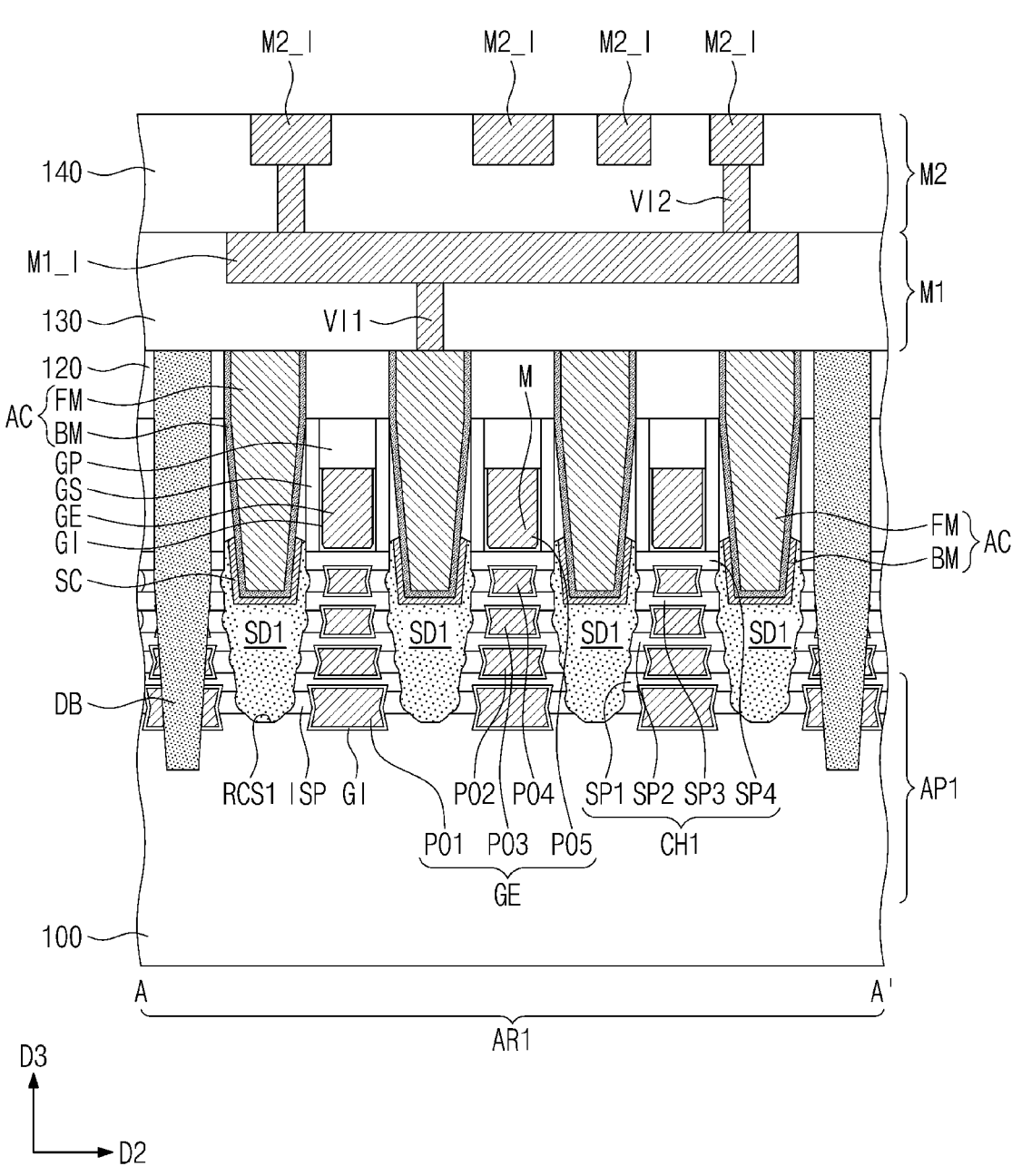
FIG. 22 is a sectional view taken along a line A-A' of FIG. 4 to illustrate a semiconductor device according to an embodiment of the inventive concept.
Figure 23:
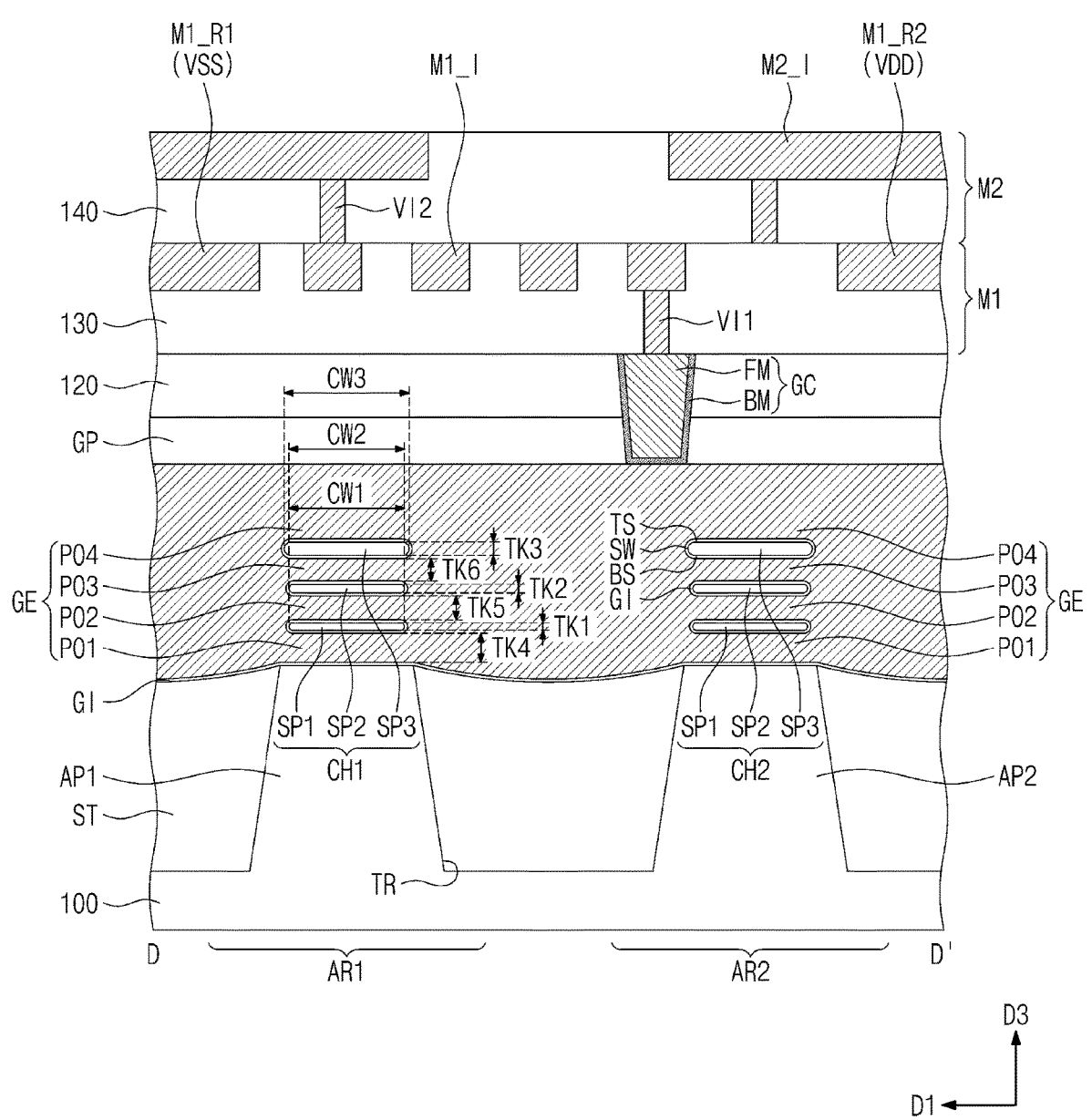
FIGS. 23 and 24 are sectional views, each of which is taken along the line D-D' of FIG. 4 to illustrate a semiconductor device according to an embodiment of the inventive concept.
Figure 24:
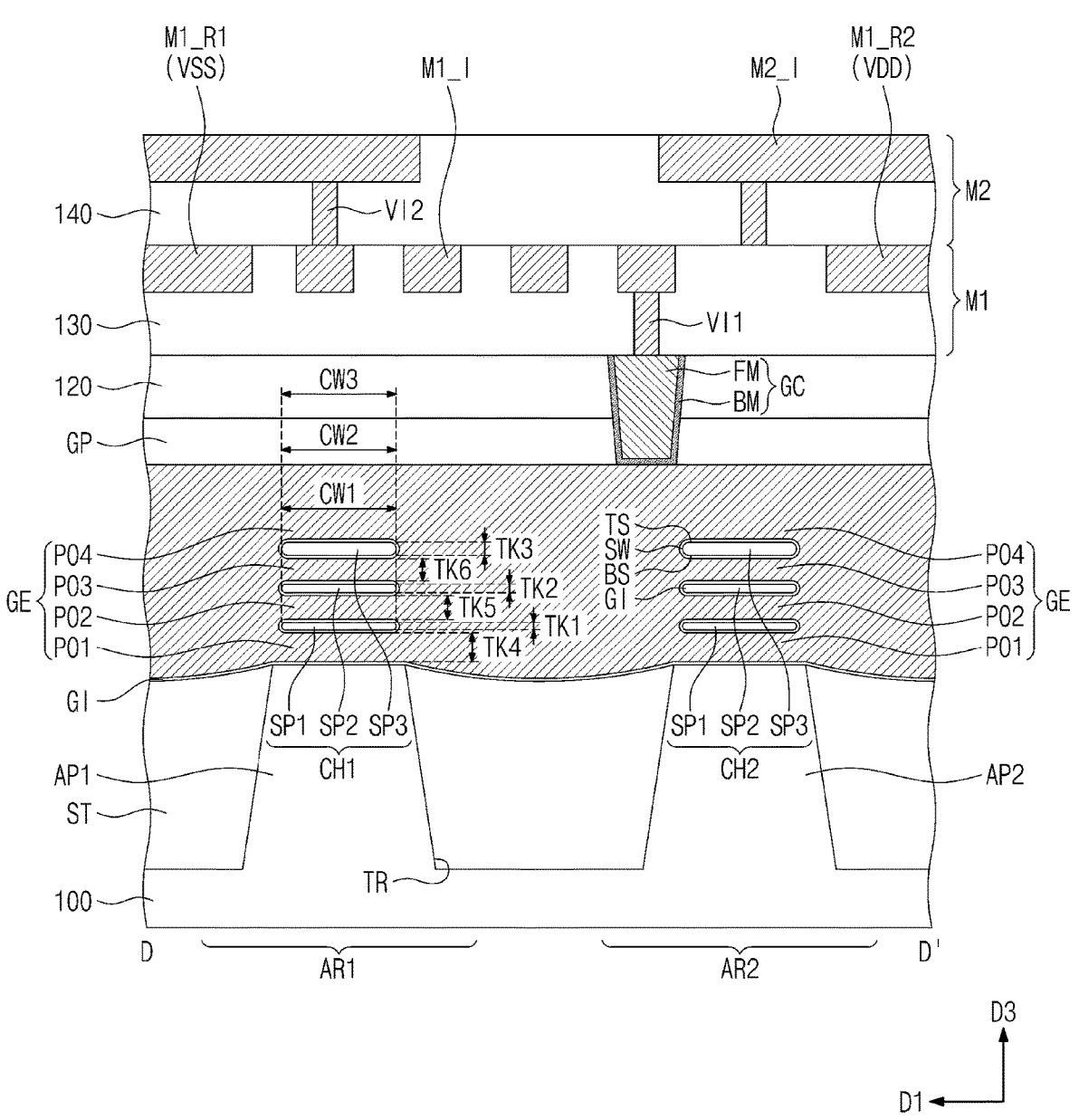

FIG. 22 is a sectional view taken along a line A-A' of FIG. 4 to illustrate a semiconductor device according to an embodiment of the inventive concept. FIGS. 23 and 24 are sectional views, each of which is taken along the line D-D' of FIG. 4 to illustrate a semiconductor device according to an embodiment of the inventive concept. In the following description, an element as previously described with reference to FIGS. 4 and 5A to 5D may be identified by the same reference number without repeating an overlapping description thereof.

Referring to FIG. 22, the first channel pattern CH1 may include first to fourth semiconductor patterns SP1 to SP4, which are sequentially stacked. For example, the first channel pattern CH1 may include four nano sheets connecting each pair of the first source/drain patterns SD1.

A three-dimensional semiconductor device according to an embodiment of the inventive concept may include a MBCFET or GAAFET, in which N nano sheets are stacked. The number N may be an integer that is greater than or equal to 2. That is, the transistor may be provided to include three or four nano sheets or to include two nano sheets or five or more nano sheets.

The gate electrode GE may include first to fourth portions PO1 to PO4, which are respectively provided below the first to fourth semiconductor patterns SP1 to SP4. The gate electrode GE may further include a fifth portion PO5, which is provided on the uppermost semiconductor pattern (i.e., the fourth semiconductor pattern SP4). Sizes or volumes of the first to fourth portions PO1 to PO4 may decrease or may gradually decrease as a distance from the lower tier in a direction toward the upper tier increases.

Referring to FIG. 23, the second thickness TK2 of the second semiconductor pattern SP2 may be larger than the first thickness TK1 of the first semiconductor pattern SP1, but the second channel width CW2 of the second semiconductor pattern SP2 may be substantially equal to the first channel width CW1 of the first semiconductor pattern SP1. The third thickness TK3 of the third semiconductor pattern SP3 may be larger than the second thickness TK2 of the second semiconductor pattern SP2, and the third channel width CW3 of the third semiconductor pattern SP3 may be larger than the second channel width CW2 of the second semiconductor pattern SP2.

Referring to FIG. 24, a thickness of a center portion of each of the first to third semiconductor patterns SP1, SP2, and SP3 may increase or may gradually increase (i.e., TK3>TK2>TK1), as a distance from the lower tier in a direction toward the upper tier increases. Meanwhile, the first to third semiconductor patterns SP1, SP2, and SP3 may have the same channel width in the first direction D1. For example, the first channel width CW1 of the first semiconductor pattern SP1, the second channel width CW2 of the second semiconductor pattern SP2, and the third channel width CW3 of the third semiconductor pattern SP3 may be substantially equal to each other.

According to an embodiment of the inventive concept, a three-dimensional field effect transistor may include a nano sheet structure with a channel recess, and this may make it possible to increase an effective channel length (ECL) of the transistor. Accordingly, it may be possible to prevent a short channel effect, such as a leakage current and drain-induced barrier lowering (DIBL) issue, and thus, a semiconductor device may be fabricated to have improved electrical characteristics. In addition, according to an embodiment of the inventive concept, it may be possible to prevent or suppress a hot carrier injection issue and thereby to improve reliability characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate provided with an active pattern;
a channel pattern on the active pattern, the channel pattern comprising semiconductor patterns, which are vertically stacked to be spaced apart from each other;
a source/drain pattern connected to the semiconductor patterns;
a gate electrode on the semiconductor patterns, the gate electrode comprising a first portion interposed between a first semiconductor pattern and a second semiconductor pattern, which are two adjacent semiconductor patterns of the semiconductor patterns; and
a gate insulating layer interposed between the first portion of the gate electrode and each of the first and second semiconductor patterns,
wherein the second semiconductor pattern is located higher than the first semiconductor pattern,
wherein the first semiconductor pattern comprises an upper surface with a first channel recess having a first depth, and
wherein the second semiconductor pattern comprises a lower surface with a second channel recess having a second depth smaller than the first depth.

2. The semiconductor device of claim 1,
wherein the first and second channel recesses are covered with the gate insulating layer.

3. The semiconductor device of claim 1,
wherein the first portion of the gate electrode is disposed between the first channel recess and the second channel recess,
wherein the first portion of the gate electrode comprises a lower portion and an upper portion,
wherein the first portion has the minimum width at an interface between the lower portion of the first portion and the upper portion thereof, and
wherein a volume of the lower portion is larger than a volume of the upper portion.

4. The semiconductor device of claim 1,
wherein the first channel recess has a first recess width, and
wherein the second channel recess has a second recess width smaller than the first recess width.

5. The semiconductor device of claim 1,
wherein the gate electrode further comprises a second portion interposed between the active pattern and the first semiconductor pattern, wherein the active pattern comprises an upper surface with a body recess having a third depth larger than the first depth, and wherein at least a portion of the second portion is provided in the body recess.

6. The semiconductor device of claim 5, wherein the source/drain pattern comprises a first protruding portion protruding toward a side surface of the first portion of the gate electrode and a second protruding portion protruding toward a side surface of the second portion of the gate electrode, and wherein a first protruding length of the first protruding portion is smaller than a second protruding length of the second protruding portion.

7. The semiconductor device of claim 1, wherein the gate electrode is extended in a first direction, wherein the first semiconductor pattern has a first channel width in the first direction, and wherein the second semiconductor pattern has a second channel width larger than the first channel width.

8. The semiconductor device of claim 1, wherein each of the first and second semiconductor patterns has a dumbbell shape, wherein the minimum thickness of the first semiconductor pattern is a first thickness, and wherein the minimum thickness of the second semiconductor pattern is a second thickness larger than the first thickness.

9. The semiconductor device of claim 1, wherein the first portion of the gate electrode has a sandglass shape, and wherein a width of the first portion decreases and then increases as a height is lowered from an upper portion thereof toward a lower portion thereof.

10. The semiconductor device of claim 1, further comprising a recess prevention layer covering a top surface of the active pattern, wherein the recess prevention layer is configured to prevent an upper portion of the active pattern from being oxidized.

11. A semiconductor device, comprising:

a substrate provided with an active pattern;

a channel pattern on the active pattern, the channel pattern comprising semiconductor patterns, which are vertically stacked to be spaced apart from each other;

a source/drain pattern connected to the semiconductor patterns;

a gate electrode on the semiconductor patterns, the gate electrode comprising a first portion interposed between a first semiconductor pattern and a second semiconductor pattern, which are two adjacent semiconductor patterns of the semiconductor patterns; and a gate insulating layer interposed between the first portion of the gate electrode and each of the first and second semiconductor patterns, wherein the first portion of the gate electrode has a sandglass shape, wherein the first portion comprises a lower portion, an upper portion, and an interface between the lower portion and the upper portion, wherein a width of the first portion decreases as a height is lowered from an upper surface of the first portion toward the interface, has a minimum value at the interface, and increases as the height is lowered from the interface toward a lower surface of the first portion, wherein a volume of the lower portion is larger than a volume of the upper portion, wherein the first semiconductor pattern comprises a first channel recess which is adjacent to the lower portion, wherein the second semiconductor pattern comprises a second channel recess which is adjacent to the upper portion, and wherein a first depth of the first channel recess is larger than a second depth of the second channel recess.

12. The semiconductor device of claim 11, wherein the gate insulating layer on the lower portion covers the first channel recess, and wherein the gate insulating layer on the upper portion covers the second channel recess.

13. The semiconductor device of claim 11, wherein the largest width of the upper portion is smaller than the largest width of the lower portion.

14. The semiconductor device of claim 11, wherein each of the first and second semiconductor patterns has a dumbbell shape, wherein the minimum thickness of the first semiconductor pattern is a first thickness, and wherein the minimum thickness of the second semiconductor pattern is a second thickness that is larger than the first thickness.

15. A semiconductor device, comprising:

a substrate including an active region;

a device isolation layer defining an active pattern on the active region;

a channel pattern and a source/drain pattern on the active pattern, the channel pattern comprising semiconductor patterns, which are vertically stacked to be spaced apart from each other;

a gate electrode on the semiconductor patterns, the gate electrode comprising portions respectively interposed between two adjacent semiconductor patterns among the semiconductor patterns;

a gate insulating layer enclosing each portion of the portions of the gate electrode;

a gate spacer on a side surface of the gate electrode;

a gate capping pattern on a top surface of the gate electrode;

an interlayer insulating layer on the gate capping pattern;

an active contact penetrating the interlayer insulating layer and electrically connected to the source/drain pattern;

a metal-semiconductor compound layer interposed between the active contact and the source/drain pattern;

a gate contact penetrating the interlayer insulating layer and the gate capping pattern and electrically connected to the gate electrode;

a first metal layer on the interlayer insulating layer, the first metal layer comprising a power line and a first interconnection line, which are electrically connected to the active contact and the gate contact, respectively; and a second metal layer on the first metal layer, wherein the second metal layer comprises a second interconnection line, which is electrically connected to the first metal layer, wherein the semiconductor patterns comprise channel recesses, respectively, and wherein depths of the channel recesses decrease as a distance increases in a vertical direction from a lowermost semiconductor pattern among the semiconductor patterns toward an uppermost semiconductor pattern among the semiconductor patterns.

16. The semiconductor device of claim 15,
wherein recess widths of the channel recesses decrease as
    a distance increases in the vertical direction.
17. The semiconductor device of claim 15,
wherein volumes of the portions of the gate electrode
    decrease as a distance increases in the vertical direc-
    tion.
18. The semiconductor device of claim 15,
wherein the minimum thicknesses of the semiconductor
    patterns increase as a distance increases in the vertical
    direction.
19. The semiconductor device of claim 15,
wherein each portion of the portions of the gate electrode
    has a sandglass shape, and
wherein each semiconductor pattern of the semiconductor
    patterns has a dumbbell shape.

\* \* \* \* \*